(12) United States Patent
Mazumder et al.

(10) Patent No.: US 9,627,042 B2
(45) Date of Patent: Apr. 18, 2017

(54) STATIC RANDOM ACCESS MEMORY CELL HAVING IMPROVED WRITE MARGIN FOR USE IN ULTRA-LOW POWER APPLICATION

(71) Applicant: THE REGENTS OF THE UNIVERSITY OF MICHIGAN, Ann Arbor, MI (US)

(72) Inventors: Pinaki Mazumder, Ann Arbor, MI (US); Jaeyoung Kim, Ann Arbor, MI (US); Nan Zheng, Ann Arbor, MI (US)

(73) Assignee: The Regents Of The University of Michigan, Ann Arbor, MI (US)

( * ) Notice: Subject to any disclaimer, the term of this patent is extended or adjusted under 35 U.S.C. 154(b) by 0 days.

(21) Appl. No.: 15/033,456

(22) PCT Filed: Dec. 30, 2013

(86) PCT No.: PCT/US2013/078262
§ 371 (c)(1),
(2) Date: Apr. 29, 2016

(87) PCT Pub. No.: WO2015/102569
PCT Pub. Date: Jul. 9, 2015

(65) Prior Publication Data
US 2016/0254045 A1    Sep. 1, 2016

(51) Int. Cl.
*G11C 11/00*    (2006.01)
*G11C 11/419*   (2006.01)
*G11C 11/412*   (2006.01)

(52) U.S. Cl.
CPC .......... *G11C 11/419* (2013.01); *G11C 11/412* (2013.01)

(58) Field of Classification Search
CPC ..................................................... G11C 11/419
USPC .......................................................... 365/156
See application file for complete search history.

(56) References Cited

U.S. PATENT DOCUMENTS

| 7,872,935 B2* | 1/2011 | Bhatia ................... G11C 11/412 365/154 |
| 7,920,410 B1 | 4/2011 | Lee et al. |
| 2003/0026150 A1 | 2/2003 | Rimondi |
| 2007/0025140 A1 | 2/2007 | Redwine |

(Continued)

OTHER PUBLICATIONS

D. Roy, et al "Bit Line and Storage Node Decoupled 13T SRAM Cell in 22-nm Technology Node", Wulfenia Journal, Mar. 2013.

(Continued)

*Primary Examiner* — Son Mai
(74) *Attorney, Agent, or Firm* — Harness, Dickey & Pierce, PLC

(57) ABSTRACT

A static random access memory (SRAM) cell is provided with improved write margin. The SRAM cell includes: a pair of inverters cross coupled to each other and forming two storage nodes; read access switches electrically coupled between a read bit line and the two storage nodes; write access switches electrically coupled between write bit lines and two storage nodes; and supply switches electrically coupled between a supply voltage and the pair of inverters and operable, in response to a signal on at least one of the write bit lines, to selectively connect the supply voltage to at least one of the inverters in the pair of inverters. During a write operation, the supply switches operate to cut off the supply voltage to the inverter in the pair of inverters having a charged state.

21 Claims, 19 Drawing Sheets

(56) References Cited

U.S. PATENT DOCUMENTS

2009/0059685 A1    3/2009   Houston
2011/0267901 A1   11/2011   Yang et al.
2012/0307574 A1   12/2012   Cheng et al.

OTHER PUBLICATIONS

J. Kim et al "A 250mV Sub-threshold Asynchronous 8051 Microcontroller with a Novel 16 16^ SRAM Cell for Improved Reliability in 40 nm CMOS", Proceedings of the 23rd ACM International Conf. on Great Lakes Symposium on VLSI (GLSVLSI'13) May, 2013.

* cited by examiner

STATIC RANDOM ACCESS MEMORY CELL HAVING IMPROVED WRITE MARGIN FOR USE IN ULTRA-LOW POWER APPLICATION

GOVERNMENT CLAUSE

This invention was made with government support under grant number FA 9550-12-1-0033 awarded by the Defense Advanced Research Projects Agency. The government has certain rights in this invention.

CROSS-REFERENCE TO RELATED APPLICATIONS

This application is a 371 National Phase of PCT/US2013/078262, filed Dec. 30, 2013 and published as WO 2015/102569 A2 on Jul. 9, 2015. The entire disclosure of the above application is incorporated herein by reference.

FIELD

The present disclosure relates to a static random access memory (SRAM) cell having improved write margin for use in ultra-low power applications.

BACKGROUND

With the advancement of CMOS VLSI technology in nanometer regime, the process, the supply voltage, and the on-chip temperature (PVT) variations have been significant issues. These variations make a digital CMOS system vulnerable since drivability of each device changes from the intended design, causing read or write upset in an SRAM, synchronization problems in a latch, and adversely affect delays in logic gates. Among these three 'canonical' CMOS circuit types which are an SRAM cell, a latch, and an inverter, an SRAM bitcell is a key component in designing a reliable system due to its highest failure rate. In addition, as the demand for ultra-low power applications has been on the rise, many techniques have been proposed, including parallel computation, clock gating, low swing signaling, dynamic voltage and frequency scaling, low swing flops and latches, and sub-threshold operation. Among these techniques, sub-threshold operation has had a high profile since dynamic power can dramatically be reduced in the sub-threshold region. In this region, sequential logic is more vulnerable to noise than combinational logic, so many sub-threshold SRAM cell structures have been proposed since the introduction of the first sub-threshold operating FFT processor.

For example, a single-ended read port was proposed by introducing two additional read transistors. These additional devices decouple its read bitline from the storage node, so the disturbance of the SRAM cell could be eliminated during read operation, which improved the stability of SRAM cell during read operation. In another example, the number of read access transistors was increased to four. The additional devices could increase the number of rows sharing a bitline due to stacking effects. In another case, a floating VDD scheme was proposed. In this work, write operation in the sub-threshold region was feasible due to a floating VDD during write operation since it weakened the feedback in the SRAM cell. In addition, a virtual ground concept driven by a read buffer foot driver was introduced, which helped leakage reduction from bit lines through read access devices. For realization of write operation in the sub-threshold region, a virtual supply scheme was introduced. In yet another example, a decoupled read port was also introduced in order to improve read static noise margin (RSNM), and halo doping was introduced in the access transistors in order to utilize reverse short channel effect, causing the increase of threshold voltage. This technique was for increasing write margin in sub-threshold region. Lastly, dynamic differential cascade voltage switch logic (DCVSL) was introduced for read access. In order to increase write margin, wordline voltage was boosted. Although these proposed bitcells improved RSNM as well as the number of rows sharing a bit line, write margin was not dramatically improved since each bitcell itself has a feedback loop in the structure so that this loop contends with write access devices. In this disclosure, a circuit arrangement is proposed for an SRAM cell, which eliminates charge contention during write operation.

This section provides background information related to the present disclosure which is not necessarily prior art.

SUMMARY

This section provides a general summary of the disclosure, and is not a comprehensive disclosure of its full scope or all of its features.

A static random access memory (SRAM) cell is provided with improved write margin. The SRAM cell includes: a pair of inverters cross coupled to each other and forming two storage nodes; read access switches electrically coupled between a read bit line and the two storage nodes and operable, in response to a signal on a read word line, to connect the two storage nodes to the read bit line; write access switches electrically coupled between write bit lines and two storage nodes and operable, in response to a signal on a write word line, to connect the two storage nodes to the write bit lines; and supply switches electrically coupled between a supply voltage and the pair of inverters and operable, in response to a signal on at least one of the write bit lines, to selectively connect the supply voltage to at least one of the inverters in the pair of inverters. During a write operation, the supply switches operate to cut off the supply voltage to the inverter in the pair of inverters having a charged state.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described in detail with reference to the accompanying drawings.

Figure 1:
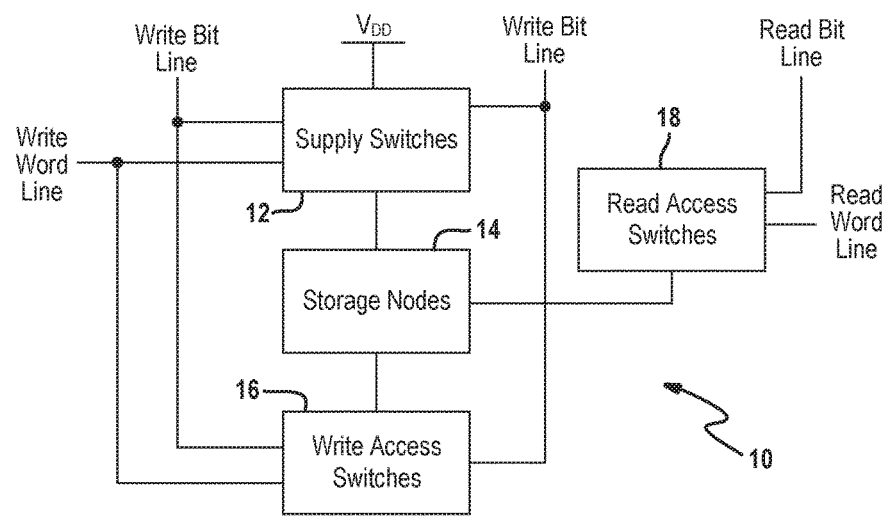
FIG. 1 is a block diagram depicting an example SRAM cell which is designed to increase write margin.

FIG. 1 depicts an example SRAM cell 10 which is designed to increase write margin. The SRAM cell 10 is comprised generally of two storage nodes 14, one or more read access switches 18, one or more write access switches 16 and two or more supply switches 12. In one example embodiment, the two storage nodes may be implemented by a pair of inverters cross coupled with each other. Other implementations for the storage nodes also fall within the broader aspects of this disclosure.

One or more write access switches 16 are electrically coupled between the storage nodes 14 and write bit lines, where the write bit lines are used to write values to the two storage nodes 14 during a write operation. In response to a signal on a write word line, the write access switches 16 operate to connect the write bit lines to the two storage nodes. Conventionally, write operation is conducted by applying state '0' or '1' to the bit lines so that the set values can override the previous state stored in the cross-coupled inverters. In this scenario, bit line input drivers should be stronger than SRAM cell transistors; otherwise, write operation may fail. Due to this characteristic of an SRAM, sizing has been one of the most dominant factors for designing an SRAM cell. This is attributed to SRAM cell's feedback loop structure—back-to-back inverter structure.

One or more read access switches 18 are electrically coupled between the two storage nodes and a read bit line, where the read bit line is used to read values of the storage nodes during a read operation. In response to a signal on a read word line, the read access switches operate to connect the read bit line to the storage nodes. In an instance of read operation, the read access switches can be used for decoupling the read bit lines from the storage nodes as an 8T SRAM cell, so these read access transistors can be free from sizing constraints. In the case of write operation, however, decoupling storage nodes from bit lines is infeasible because some paths through which charges can be stored or discharged should directly be connected to those nodes. Accordingly, an alternative needs to be proposed—a static logic style.

Thus, the SRAM cell further includes two or more supply switches 12 electrically coupled between a supply voltage and the storage nodes. In response to a signal on the write word line, the supply switches selectively connect the supply voltage to one of the pair of inverters which comprise the storage nodes 14. More specifically, the supply switches 12 operate to cut off the supply voltage to the inverter having a charged state (i.e., '1' value) during a write operation. During a read operation, the supply switches operate to connect the supply voltage to the pair of inverters. The SRAM is fully operated in static mode during read and write operation as further explained below.

Figure 2:
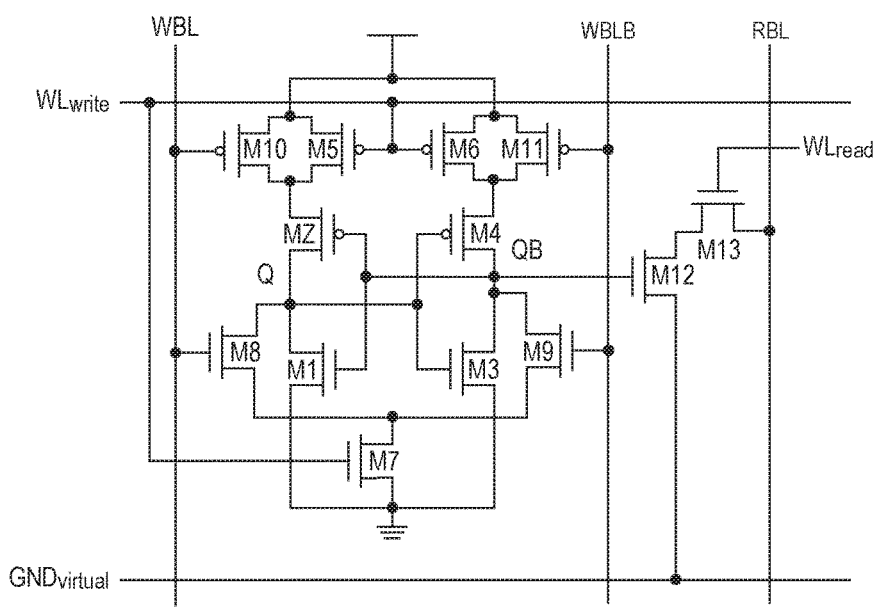
FIG. 2 is a schematic of an example embodiment of a SRAM cell having thirteen transistors (13T SRAM)

FIG. 2 is a detailed schematic of an example embodiment of the SRAM cell. In the example embodiment, storage nodes Q and QB are comprised of transistors M1 through M4. More specifically, transistors M1 through M4 are arranged as a pair of inverters cross coupled with each other. The transistors may be further defined as field-effect transistors (FETs), where the M2 and M4 have p-type channels and M1 and M3 have n-type channels. It is readily understood that other types of transistors may be used to implement the SRAM cell.

Supply switches 12 are comprised of transistors M5, M6, M10 and M11. Transistors M5, M6, M10 and M11 may be further defined as two pairs of field-effect transistors (FET) having a p-type channel, such that each pair of FETs have source terminals coupled to the supply voltage, and drain terminals coupled to one of the two inverters. Additionally, a gate terminal of one of the supply transistors is coupled to a write bit line; whereas, a gate terminal of the other supply transistor is coupled to a write word line. Other arrangements for the supply switches are also contemplated within the broader aspects of this disclosure.

Write access switches 14 are comprised of transistors M7 to M9. Transistors M7 to M9 may be further defined as field-effect transistors (FET) having a n-type channel. In the example embodiment, transistor M8 has its drain terminal coupled to one of the two storage nodes, Q, and its gate terminal coupled to one of the two write bit lines, WBL; transistor M9 has its drain terminal coupled to the other storage node, QB, and has gate terminal coupled to the second write bit line, WBLB; and transistor M7 has its drain terminal coupled to both of the source terminals of M8 and M9, its gate terminal coupled to the write word line, $WL_{write}$, and its source terminal coupled to ground. Other arrangements for the write access switches are also contemplated within the broader aspects of this disclosure.

Read access switches 18 are comprised of transistors M12 and M13. Transistors M12 and M13 may be further defined as field-effect transistors (FET) having an n-type channel. In the example embodiment, transistors M12 and M13 have their drain terminals coupled together. Transistor M12 also has its gate terminal coupled to the storage nodes and its source terminal coupled to ground. Transistor M13 has its gate terminal coupled to the read word line, $WL_{read}$, and its source terminal coupled to ground. Other arrangements for the read access switches are also contemplated within the broader aspects of this disclosure.

Figure 3A:
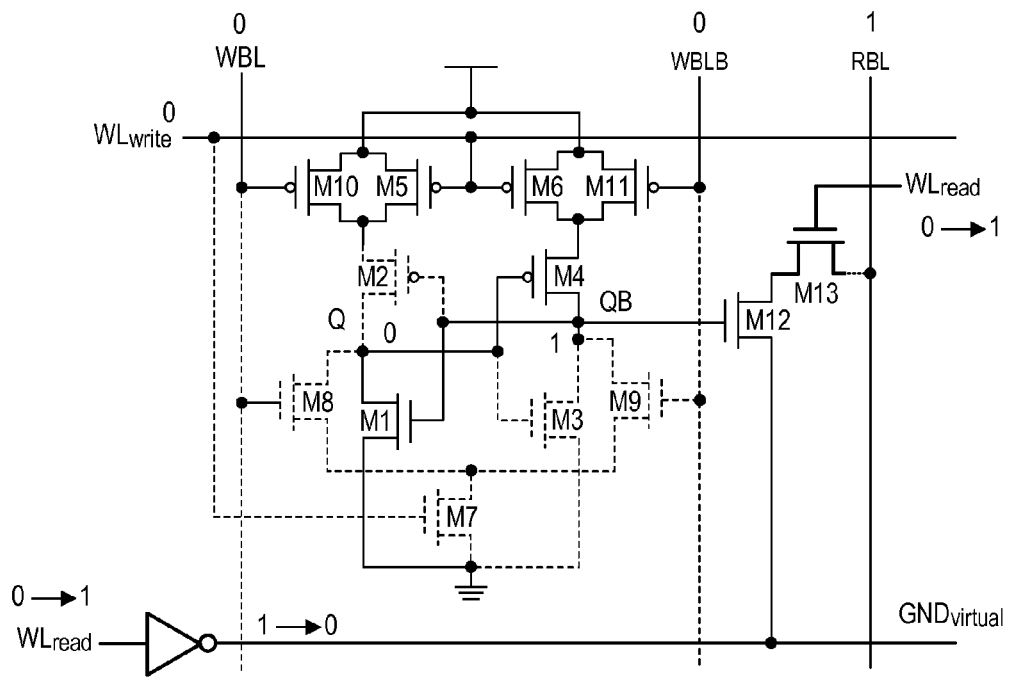
FIGS. 3A and 3B are schematics of the example 13T SRAM cell depicted during a read operation.
Figure 3B:
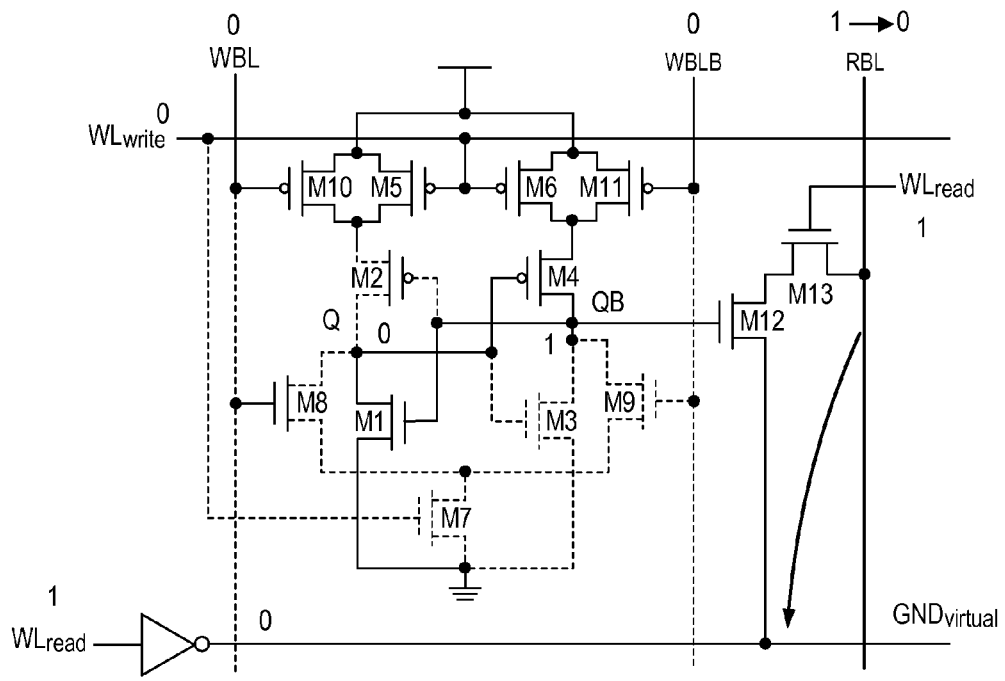

Read operation is conducted through devices M12 and M13 as described in relation to FIGS. 3A and 3B. As in a conventional 8T SRAM, the storage node QB is decoupled from the read bit lines RBL by device M12. In this case, M12 is turned on. When $WL_{read}$ is asserted, a path from RBL to $GND_{virtual}$ is becoming transparent, and $GND_{virtual}$ is driven to GND by a driver as shown in FIG. 3A. Once this path is transparent, charges on the floating bit line, RBL, begin to be discharged through the path as shown in FIG. 3B. This process is the completion of read operation. After this completion, $WL_{read}$ is deasserted, and RBL is precharged to VDD while $GND_{virtual}$ is driven VDD so that the leakage due to lack of voltage difference between RBL and $GND_{virtual}$ can be reduced when the SRAM cells connected to this word line are not used. It brings about more rows of cells shared in bit lines since the leakage has been an obstacle to increase the number of rows of cells.

The write operation is a key feature of the 13T SRAM cell design. FIGS. 4A-4F show a series of processes in a write operation. The basic principle is to make a SRAM cell operate in static mode without charge contention.

Figure 4A:
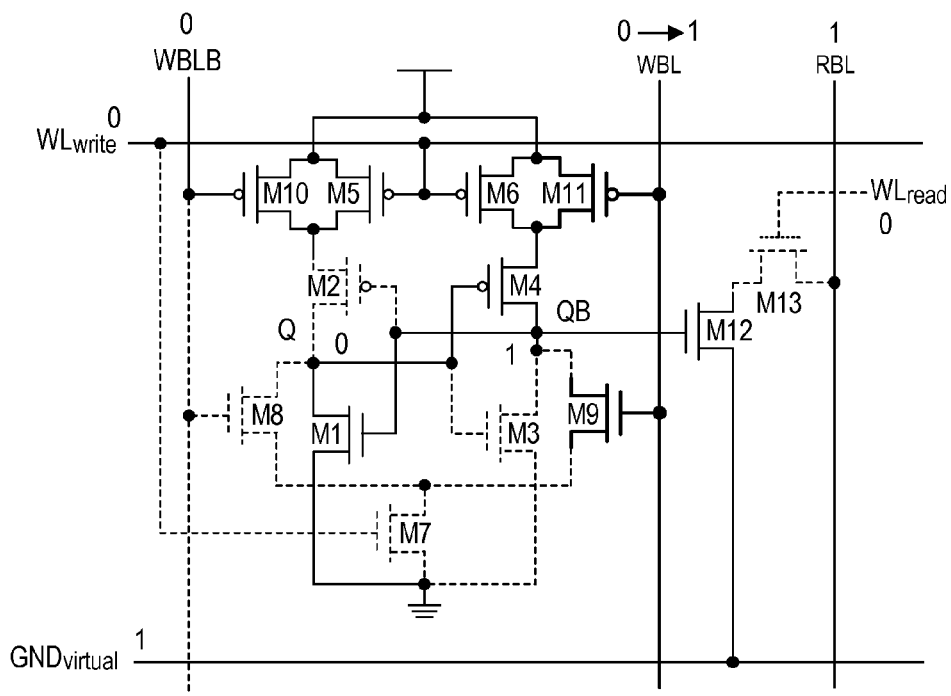
FIGS. 4A-4F are schematics of the example 13T SRAM cell depicted during a write operation.
Figure 4B:
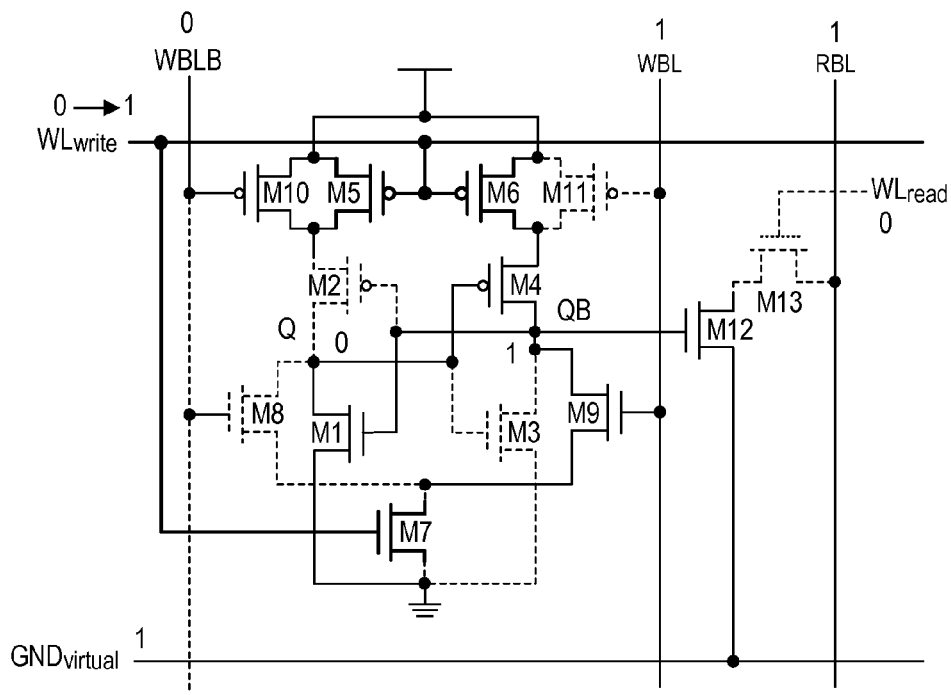
Figure 4C:
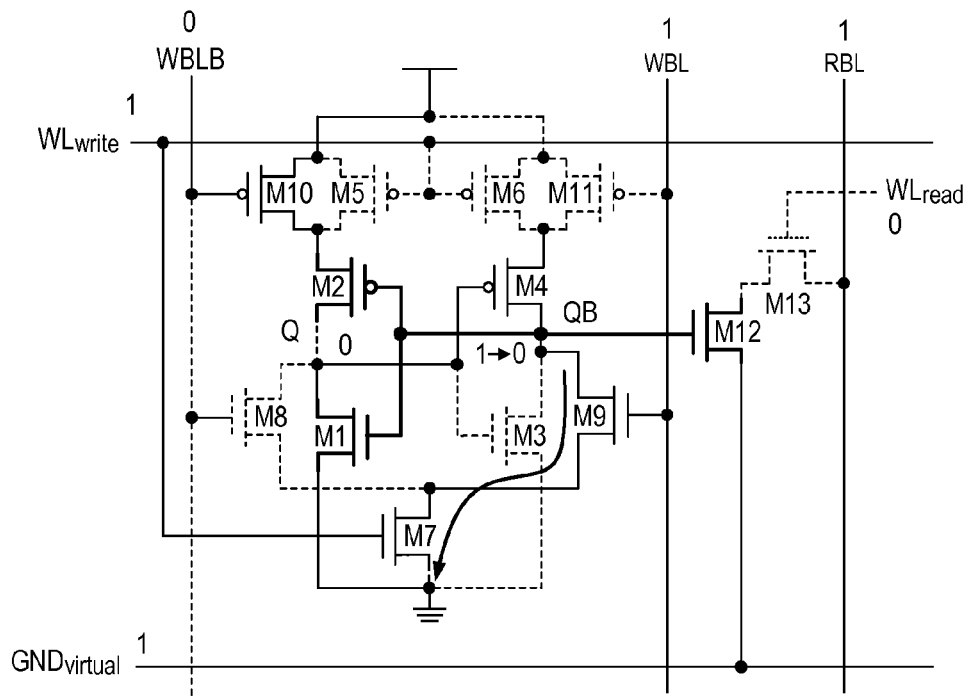
Figure 4D:
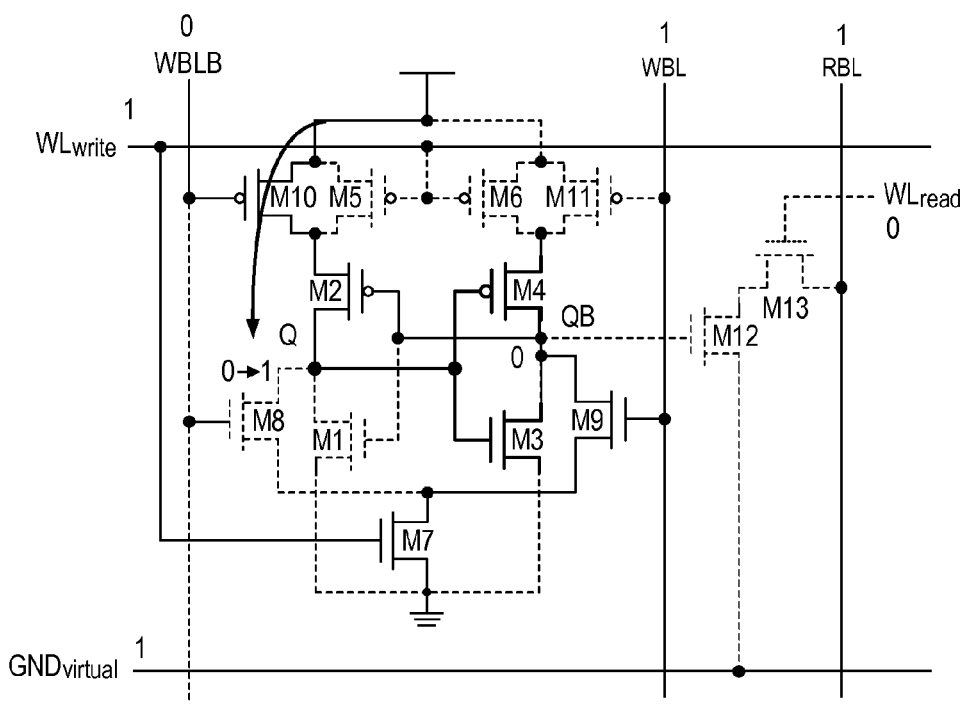
Figure 4E:
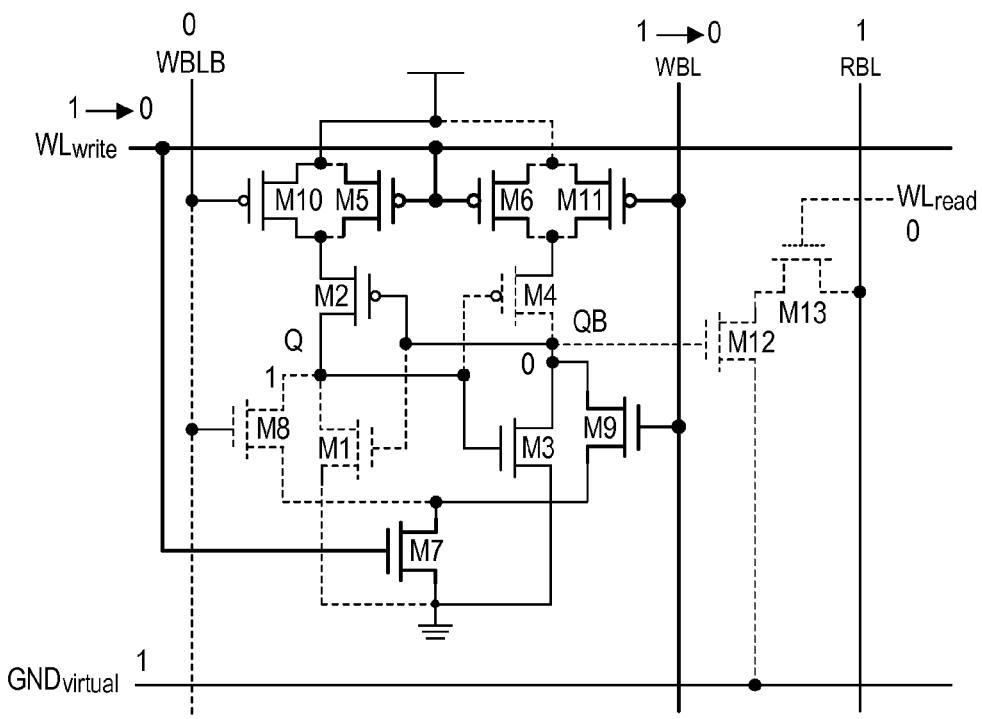
Figure 4F:
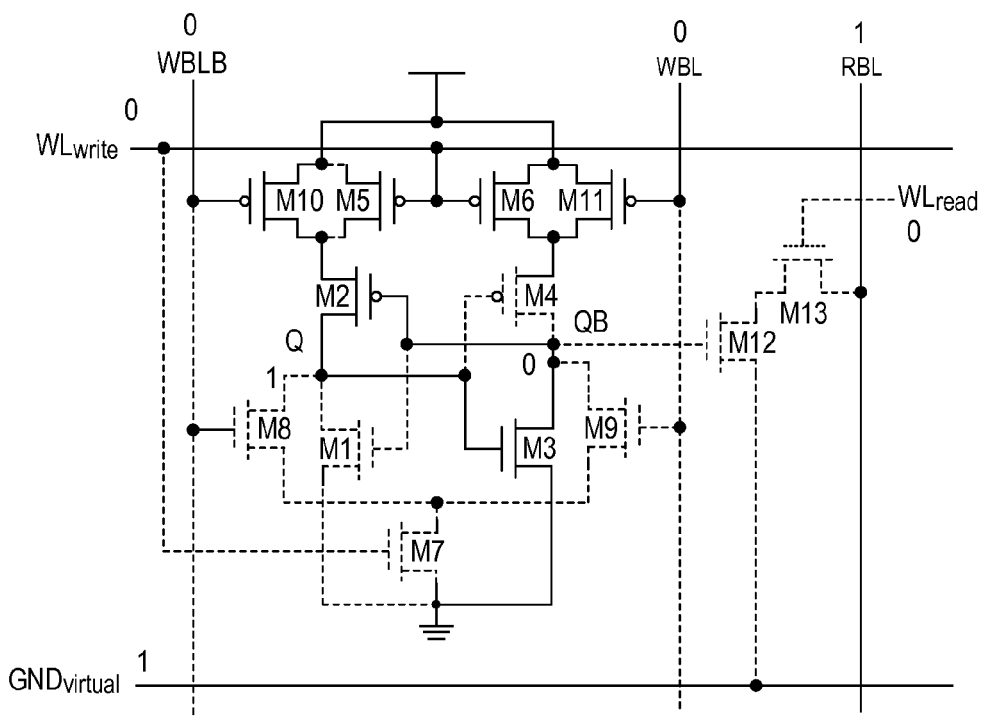

The write operation illustrated in FIGS. 4A-4F is writing '1' to node Q assuming that '0' is initially stored at node Q and '1' is initially stored at node QB. To begin, keep '0' at node WBLB, while asserting '1' at node WBL, so that M9 and M10 are turned on and M8 and M11 are turned off as shown in FIG. 4A. Next, $WL_{write}$ is asserted, which causes M5 and M6 to turn off, and M7 to turn on as shown in FIG. 4B. Notice that both paths from the supply to node Q and QB are cut, so no current can flow into the storage nodes. Instead, a path from node QB to GND is formed. Accordingly, discharge is incurred through this path as shown in FIG. 4C. This discharge turns M2 on, while it turns M1 and M12 off, so a path from VDD through M10 and M2 to node Q is transparent, while a path to GND is closed. This, in turn, charges node Q, causing M3 to become transparent, while switching M4 off as shown in FIG. 4D. At this moment, writing of '1' to node Q and '0' to node QB is completed. Subsequently, the asserted signal on $WL_{write}$, WBL, and WBLB should be reset to '0' as shown in FIG. 4E. With this reset, M5, M6, M10 and M11 can transfer power to the cross-coupled inverters, while M7-M9 are turned off. FIG. 4F shows the state of the SRAM cell after the completion of write operation.

Figure 5:
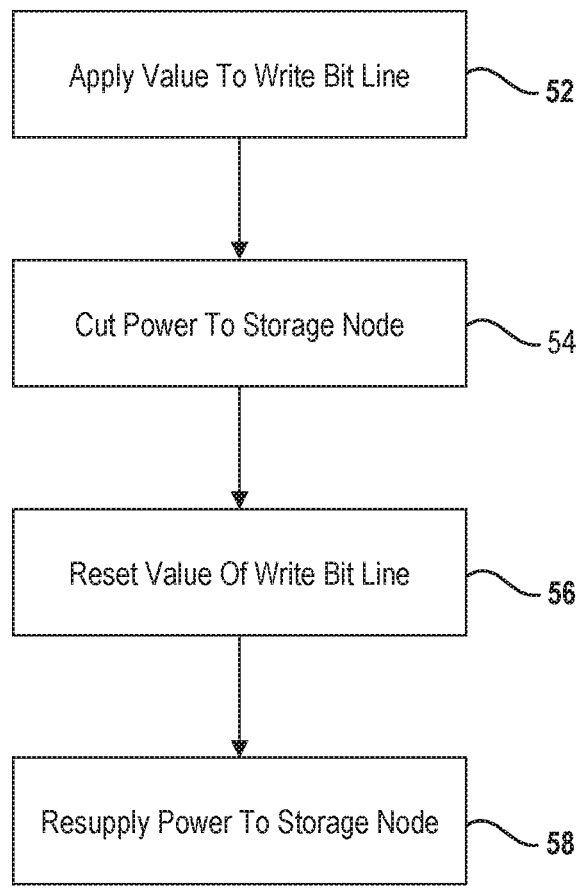
FIG. 5 is a flowchart summarizing steps for performing a write operation in the example 13T SRAM cell.

This method for performing a write operation in an SRAM cell can be summarized as shown in FIG. 5. In the standby mode, the state of the SRAM cell is maintained as long as a supply voltage is supplied to each of the inverters which comprise the SRAM cell.

To perform a write operation, a value to be written is applied to the applicable write bit line as indicated at 52. Charge contention between the nodes is then reduced at 54 which allows the storage node having the lower voltage to change rapidly. This disclosure contemplates that charge contention can be reduced in different ways. In the embodiment described above, the supply voltage is cut off to the storage node having the higher voltage state. Charge contention is further reduced by creating a discharge path from the storage node having the higher voltage state to ground. Because the storage node having the lower voltage state is cross coupled with the other node and continues to be supplied by the supply voltage, it is immediately charged.

To complete the write operation, the value applied to the write bit line is reset (i.e., 1→0) and the supply voltage is resupplied to both storage nodes as indicated at 56 and 58, respectively, thereby maintaining the newly written state of the SRAM cell. It is to be understood that only the relevant steps of the method are discussed in relation to FIG. 5, but that other steps may be needed to perform the write operation.

In the example embodiment above, the 13T SRAM cell has no charge contention during read or write operations. Thus, sizing only affects the performance of SRAM and its static and dynamic noise margins, not its functionality. This is one of the advantages of this SRAM cell since engineering efforts to design an SRAM cell can dramatically be reduced. Unless performance is a matter of importance, every device size can be minimum. This can help to reduce energy consumption during read or write operation. However, M2 and M4 need to be sized as twice as minimum for a balanced pull-up and pull-down strength, which determines static noise margin.

Figure 6:
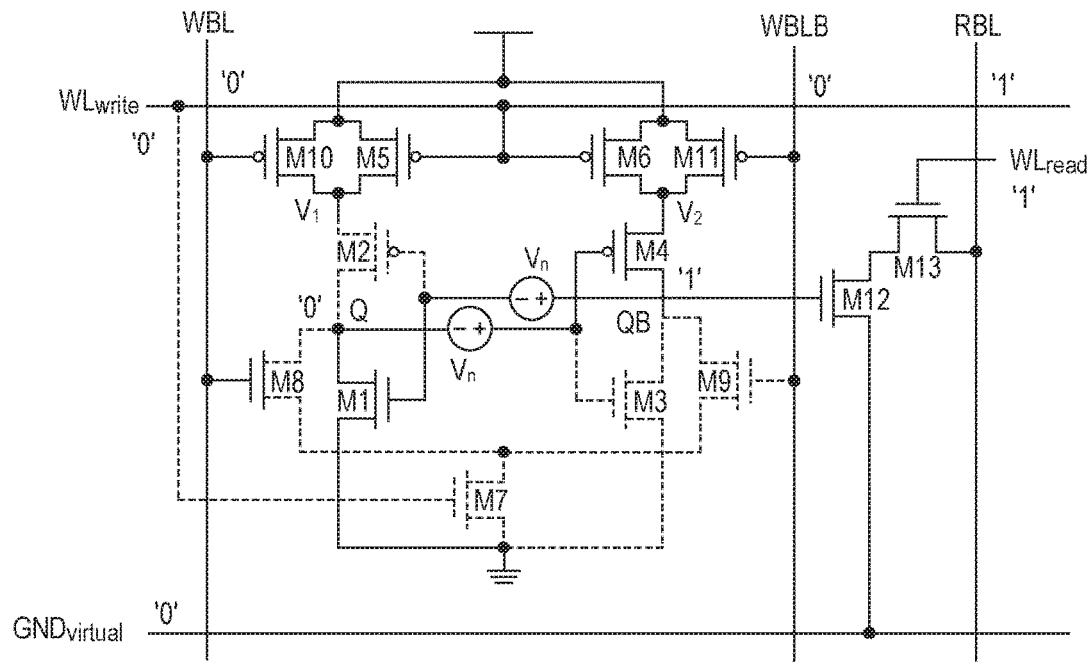
FIG. 6 is a schematic of the 13T SRAM cell with static noise source inserted for read SNM.

FIG. 6 shows static noise sources inserted at feedback nodes. Since M5, M6, M10, and M11 are on, both nodes $V_1$ and $V_2$ are charged with VDD. In addition, M7 to M9 are also in off state. Only inverters (M1 through M4), M12 and M13 are relevant during the read operation. Accordingly, the proposed 13T SRAM cell is very similar to the conventional 8T SRAM cell during read operation as shown in read SNM simulation results.

Many definitions of write margin have been proposed in literature. The conventional write static noise margin (WSNM) are based on the VTCs of the back-to-back inverters. In this definition, two static noise sources are injected in the feedback loop of the back-to-back inverters so that these sources prevent the bitcell from writing. Accordingly, the minimum voltage of the noise sources that forces the bitcell to hold the previous data during write operation can be defined as WSNM. Another definition of write margin is bitline write margin (BLWM). In this definition, a static noise source is injected in a bitline which is supposed to be "0". In other words, it can be assumed that a bitline driver cannot force a bitline to discharge fully. Since write operation begins with discharging, this injected noise source could affect the write operation, so BLWM can be the noise voltage at which discharging cannot flip the state of a bitcell. Other definitions of write margin are related to the wordline. For example, in K. Takeda et al's "Redefinition of Write Margin for Next-Generation SRAM and Write-Margin Monitoring Circuit", the wordline voltage of a half cell is swept so that one of the inverters can flip at a certain voltage, from which to VDD can be a wordline write margin (WWM). In N. Gierczynski et al's "A New Combined Methodology for Write-Margin Extraction of Advanced SRAM", a newly combined wordline write margin (CWWM) is proposed after analyzing the drawback of WWM. Instead of sweeping a wordline voltage of a half cell, the whole wordline voltage is swept in order to acquire CWWM. CWWM can be the difference between VDD and the wordline voltage where the storage nodes flip to the opposite state. These definitions are examined in H. Makino et al's "Reexamination of SRAM Cell Write Margin Definitions in View of Predicting The Distribution", and it was concluded that CWWM follows PVT variations better than the others. However, WSNM would be used in analytical modeling since WSNM is a counterpart of the conventional read noise margin in write operation. Thus, this gives better understanding of the relations between each device.

Figure 7:
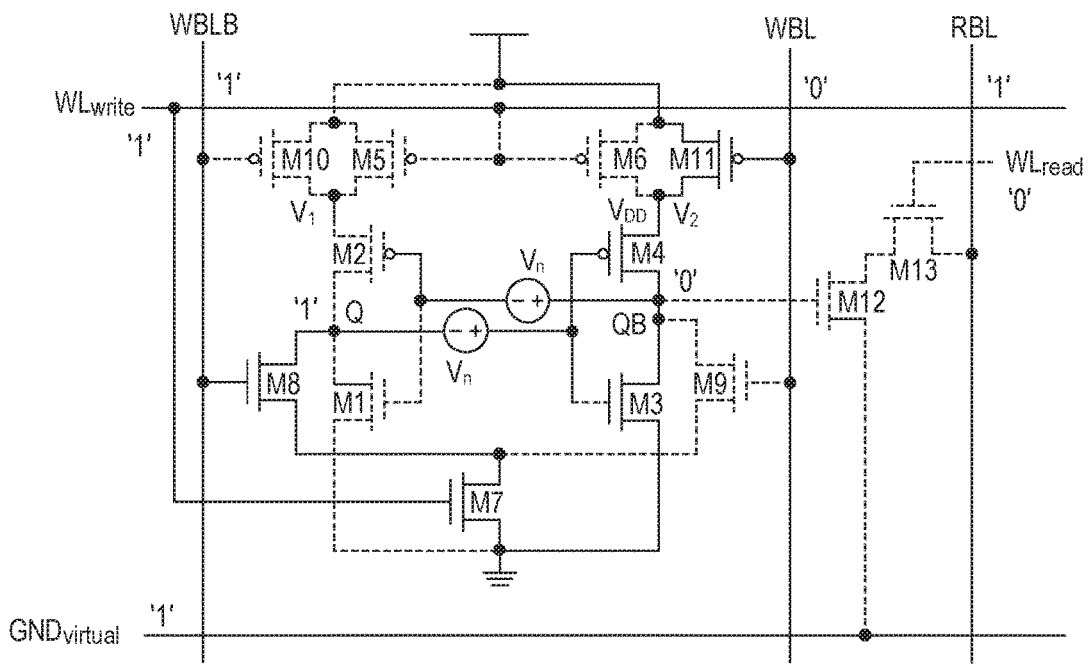
FIG. 7 is a schematic of the 13T SRAM cell with static noise source injected for the conventional write static noise margin.

Static noise sources for write margin are inserted at feedback paths as shown in FIG. 7. In contrast with read SNM, the signs of the noise sources are opposite since these sources should function to disturb write operation. In other words, these sources increase the stability of the SRAM cell during hold and read. Assume that state "1" is stored at node Q, and value "0" is being written, so WBLB is set as "1", while WBL as "0". In addition, $WL_{write}$ is also asserted, and $WL_{read}$ is deactivated ($GND_{virtual}$ is in "1" state). In this scenario, the charges stored at node Q as well as at node $V_1$ begin to discharge through M8 and M7 since M2 is on. Accordingly, the voltage at node Q and at node $V_1$ is regarded as "0" in the dc analysis point of view. Moreover, the voltage at node V2 can be considered VDD because M11 is always in 'on' state. Since the node voltage at Q is "0", writing "1" to node Q is the complete of the write operation. Therefore, $V_n$ at which the drain current of M3 is the same as the one of M4 can be the static write margin since charges can barely be accumulated at QB, meaning almost "0" state. With these assumptions, the analytical model for write margin is acquired.

Assume M3 operates in the linear region, while M4 operates in the saturation region since "0" is stored at QB, so $V_{DS4}$ is almost VDD. Equating drain currents of both M3 and M4 results in:

$$\frac{k_4}{2}(V_{SG4} - V_{tp})^2 = k_3 V_{DS3}\left(V_{GS3} - V_{tn} - \frac{V_{DS3}}{2}\right) \quad (1)$$

where $$k_3 = \mu_n C_{ox}\left(\frac{W}{L}\right)_3,$$

$$k_4 = \mu_p C_{ox}\left(\frac{W}{L}\right)_4,$$

and $V_{tn}$ and $V_{tp}$ are the threshold voltages of nMOS and pMOS, respectively. For simplicity, $\mu_p$ and $V_{tp}$ are treated as positive values.

From Kirchhoff's voltage law (KVL), the following equations are acquired:

$$V_{GS3} = V_Q + V_n \quad (2)$$

$$V_{SG4} = V_{DD} - V_Q - V_n \quad (3)$$

$$V_Q = 0. \quad (4)$$

Notice that we only have the VTC of inverter 2; the VTC of inverter 1 is constant ($V_Q=0$). Substituting these into (1) yields:

$$V_{DS3}^2 - 2(V_n - V_{tn})V_{DS3} + \frac{\mu_p}{\mu_n}\beta(V_{DD} - V_{tp} - V_n)^2 = 0 \quad (5)$$

where $$\beta = \frac{\left(\frac{W}{L}\right)_4}{\left(\frac{W}{L}\right)_3}.$$

When (5) has two distinct real roots, the SRAM cell is regarded to hold the current state—retaining bistability. If (5) has two distinct complex roots, the SRAM cell cannot hold data—monostable, so write operation can be performed. Therefore, $V_n$ at which (5) has a double root can be the write margin—both VTCs coincide at a point. This condition is identical to the discriminant of the quadratic equation (5) as shown below:

$$aV_{DS3}^2 + bV_{DS3} + c = 0$$

$$b^2 = 4ac \quad (6)$$

or $$b = -2\sqrt{ac} (\because b<0). \quad (7)$$

When (6) and (7) are applied to (5), the following equation is yielded:

$$2(V_n - V_{tn}) = 2\sqrt{\frac{\mu_p}{\mu_n}}\beta(V_{DD} - V_{tp} - V_n) \quad (8)$$

After solving (8) for $V_n$, the static write margin for the super-threshold operation condition can be acquired:

$$\therefore WM_{static,super-V_{th}} = \frac{V_{tn} + \sqrt{\frac{\mu_p}{\mu_n}}\beta(V_{DD} - V_{tp})}{1 + \sqrt{\frac{\mu_p}{\mu_n}}\beta}. \quad (9)$$

Modeling the static write margin for sub-threshold operating condition is similar to the case for super-threshold except for the expression of the drain current of a device. In this modeling, every parameter is treated as a positive value. At node QB, the drain currents of M3 and M4 can be equated by Kirchhoff's current law (KCL).

$$I_{SD4} = I_{DS3}. \quad (10)$$

The drain current of each device can be represented as below:

$$I_D = I_s e^{\frac{V_{GS} - V_t}{n\phi_T}}\left(1 - e^{-\frac{V_{DS}}{\phi_T}}\right) \quad (11)$$

where $$I_S = \mu\left(\frac{W}{L}\right)\sqrt{\frac{q\epsilon_{si}NDEP}{2\phi_S}}(\phi_T)^3,$$

$$n = 1 + \frac{C_d}{C_{ox}},$$

$$\phi_T = \frac{kT}{q}.$$

Since $$1 \gg e^{\frac{V_{DS}}{\phi_T}},$$

$$e^{\frac{V_{DS}}{\phi_T}}$$

term can be dismissed, so substituting (11) into (10) yields:

$$I_{S,4} e^{\frac{V_{SG4} - V_{tp}}{n\phi_T}} = I_{S,3} e^{\frac{V_{GS3} - V_{tn}}{n\phi_T}}. \quad (12)$$

As the case of super-threshold modeling, the same conditions—(2) to (4)—are applicable to (12). After substituting, solving (12) for $V_n$ yields the static write margin for sub-threshold condition:

$$\therefore WM_{static,sub-V_{th}} = \frac{1}{2}n\phi_T \ln\left(\frac{\mu_p}{\mu_n}\beta e^{\frac{V_{DD} - V_{thp} - V_{thn}}{n\phi_T}}\right). \quad (13)$$

Figure 8A:
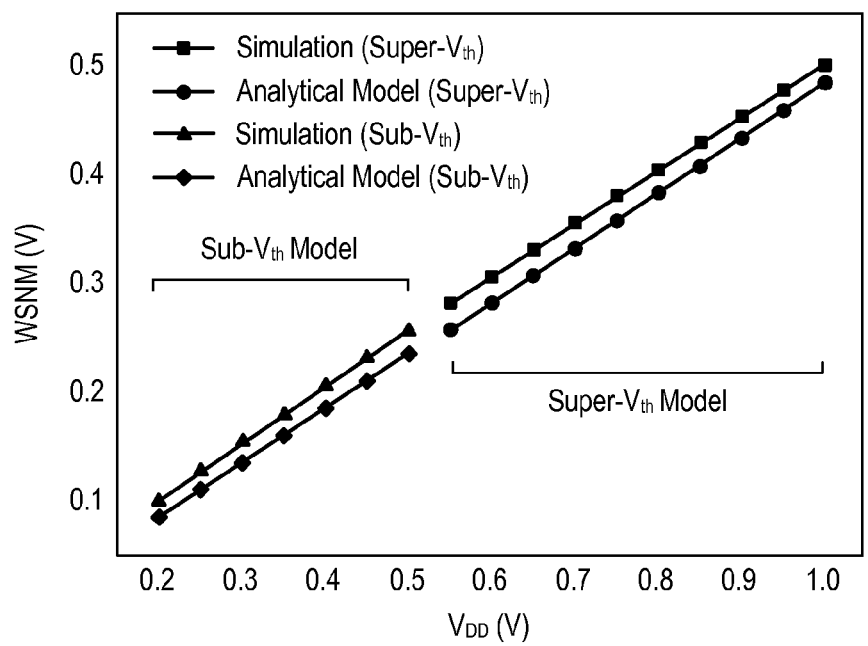
FIGS. 8A and 8B are graphs comparing WSNM analytical models with simulation results.
Figure 8B:
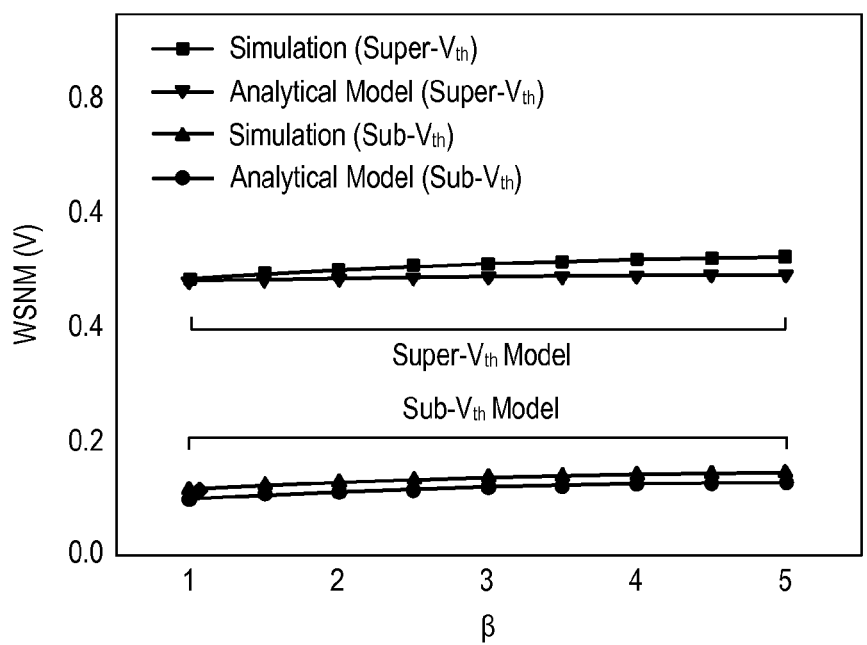

WSNM analytical models developed earlier are compared with simulation results as shown in FIGS. 8A and 8B. FIG. 8A shows the comparison of super-threshold and sub-threshold models with simulation results versus VDD. The error range of super-threshold model is 3.1% to 8.7%, while sub-threshold model has 8.1% to 14.2% error range. The reason why the error of the sub-threshold model is greater than the other is that leakage current exponentially increases as the device goes to deep sub-threshold region, and we assumed an off-state device has no current in modeling.

The WSNM simulation results by changing β are compared to the analytical model as shown in FIG. 6B. Super-threshold model is verified at VDD=1.0V, while subthreshold one at VDD=0.25V. The error range of super-threshold model is from 0.59% to 6.17%, while the range of sub-threshold model is from 10.43% to 15.42%. Although sub-threshold curves seem to be closer than super-threshold curves in the figure, the accuracy of the latter is greater. Since WSNM values in sub-threshold are relatively smaller, a tiny change of the value makes a great difference in error. If the two values in the sub-threshold region are compared, the difference range is within 17.80 mV.

Figure 9:
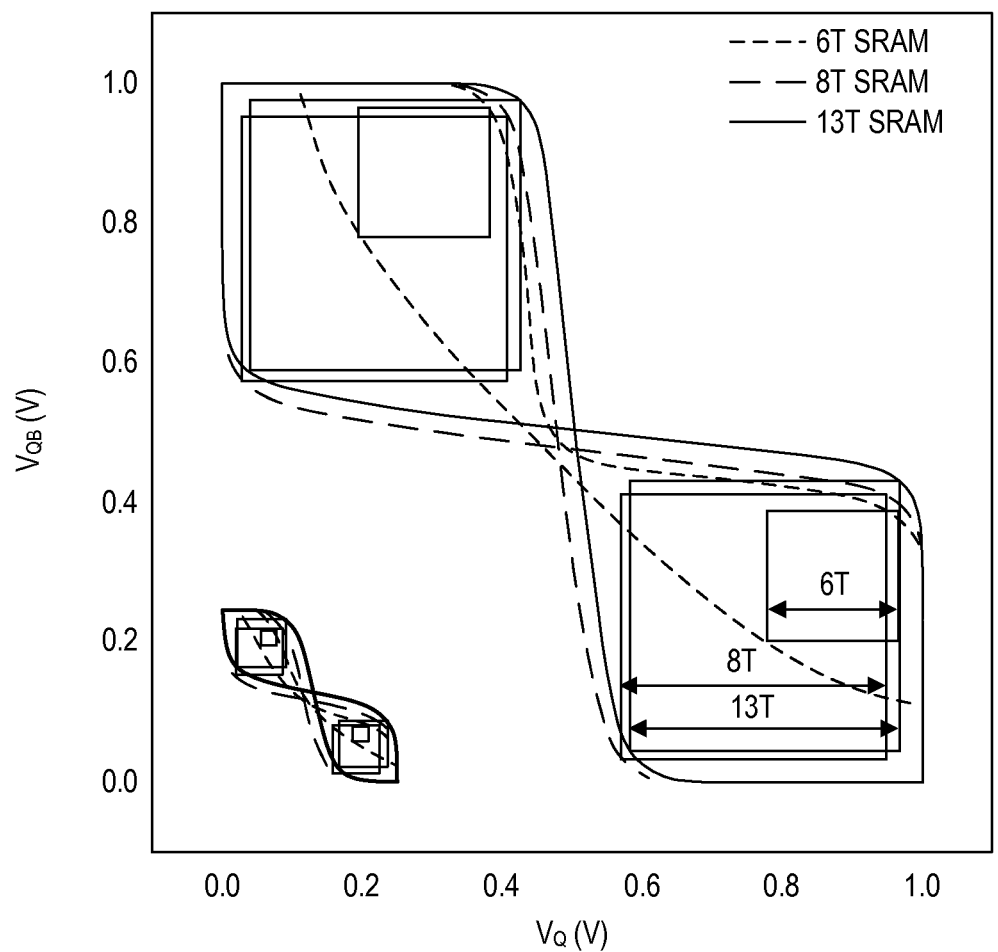
FIG. 9 is a graph depicting simulation results of read SNM.
Figure 10A:
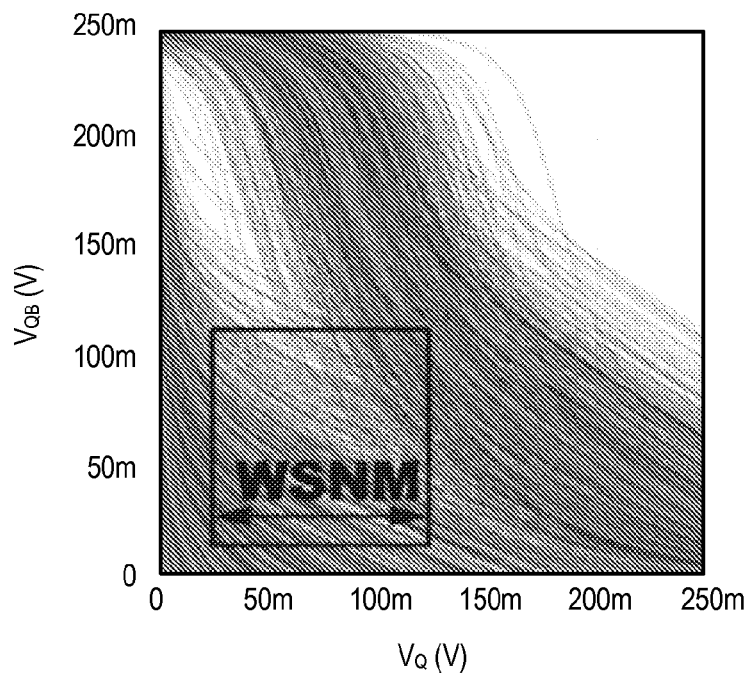
FIGS. 10A-10F are graphs depicting simulation results for write static noise margin (WSNM), combined wordline write margin (CWWM) and bitline write margin (BLWM), respectively, for a 6T SRAM cell arrangement.
Figure 10B:
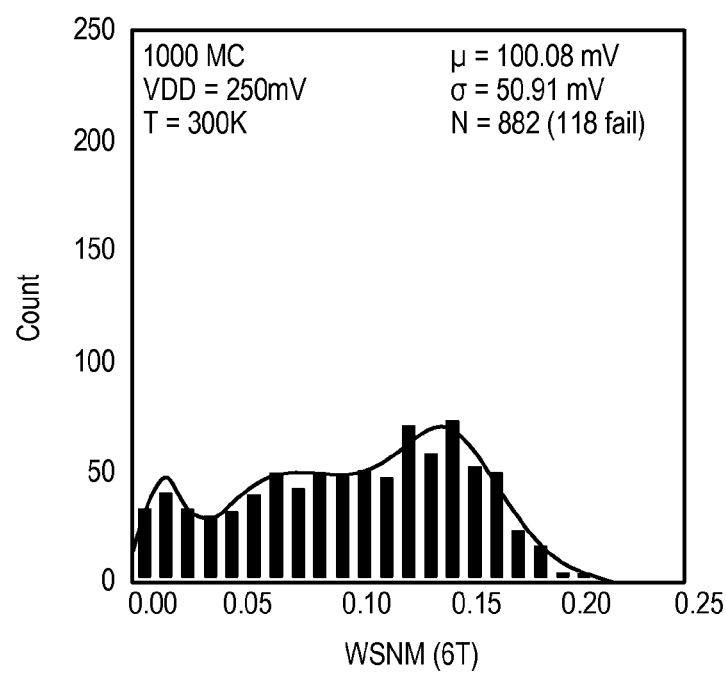
Figure 10C:
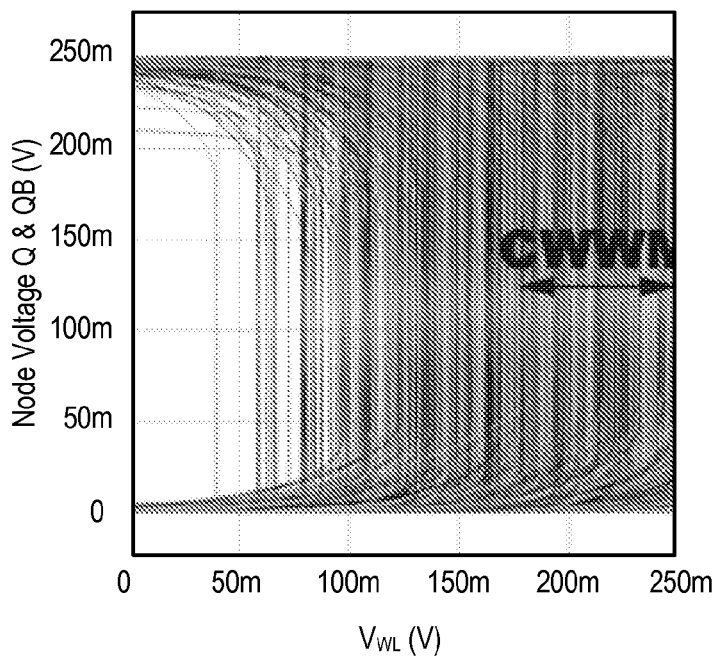
Figure 10D:
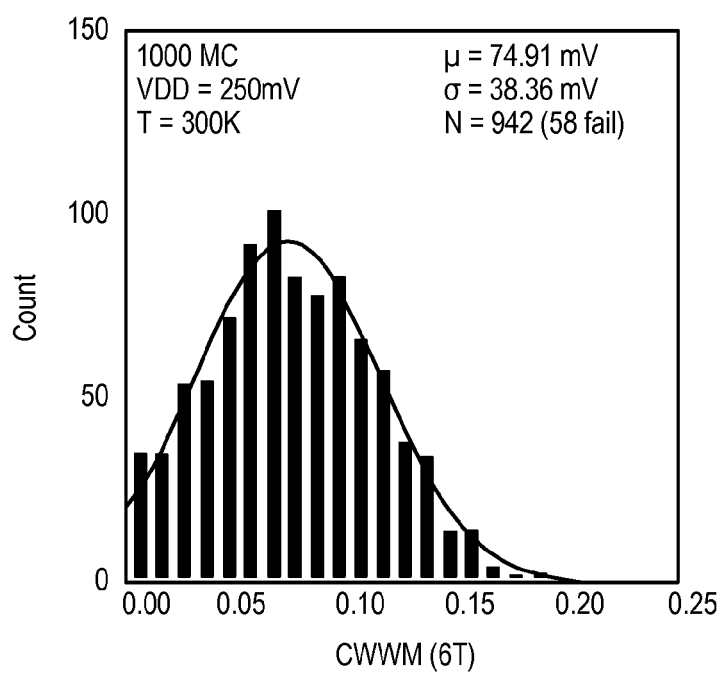
Figure 10E:
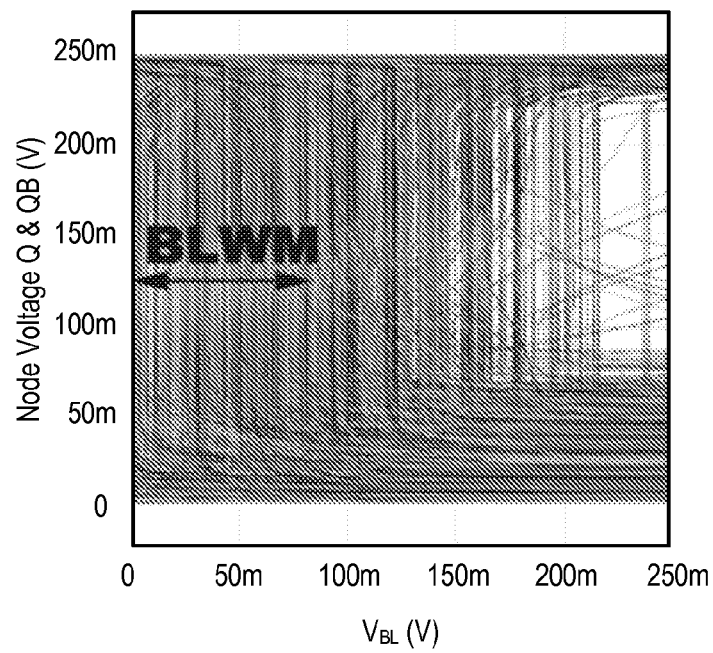
Figure 10F:
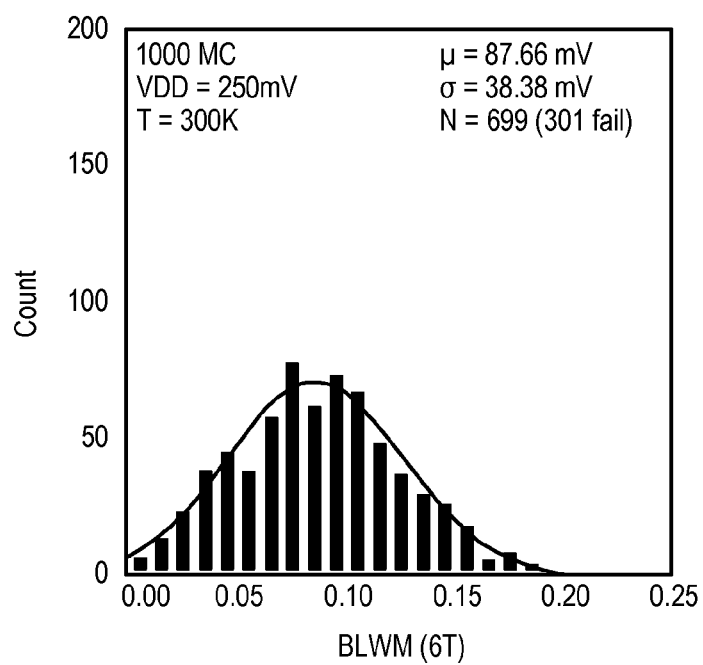
Figure 10G:
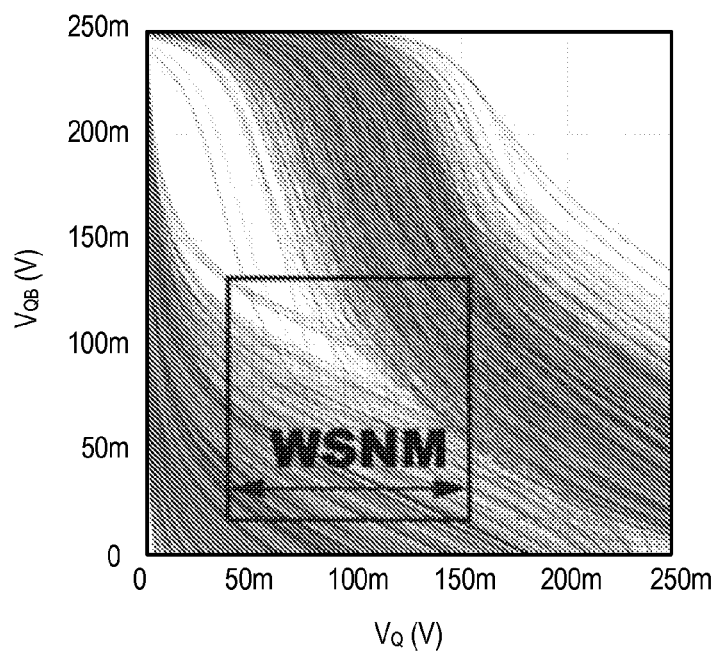
FIGS. 10G-10L are graphs depicting simulation results for write static noise margin (WSNM), combined wordline write margin (CWWM) and bitline write margin (BLWM), respectively, for a 8T SRAM cell arrangement.
Figure 10H:
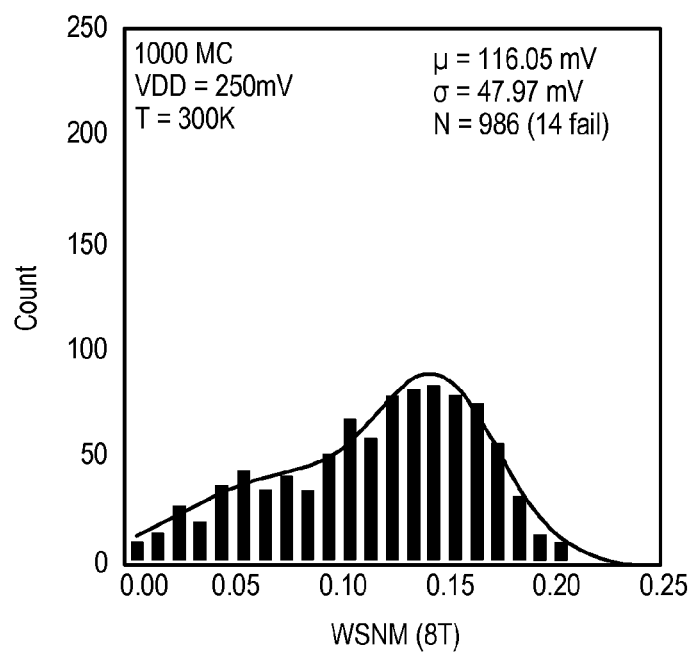
Figure 10I:
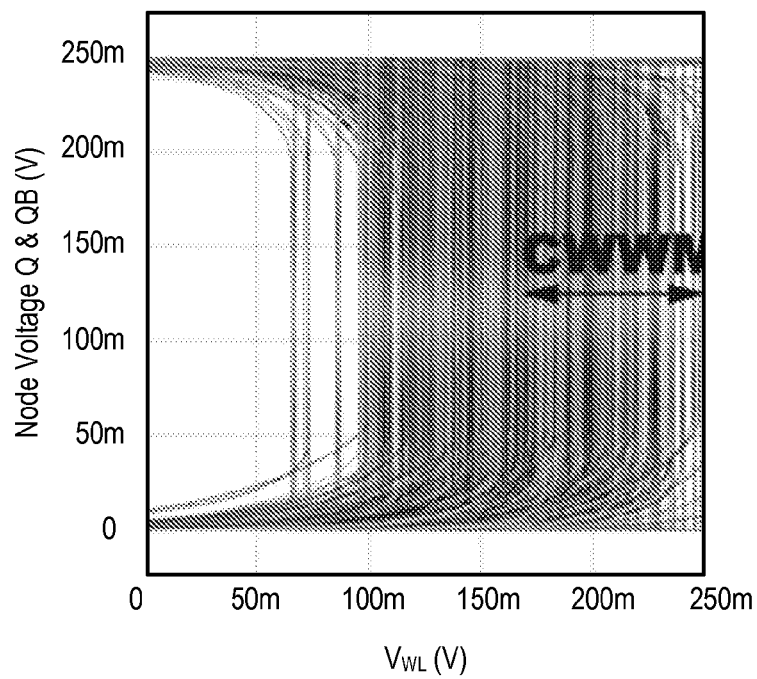
Figure 10J:
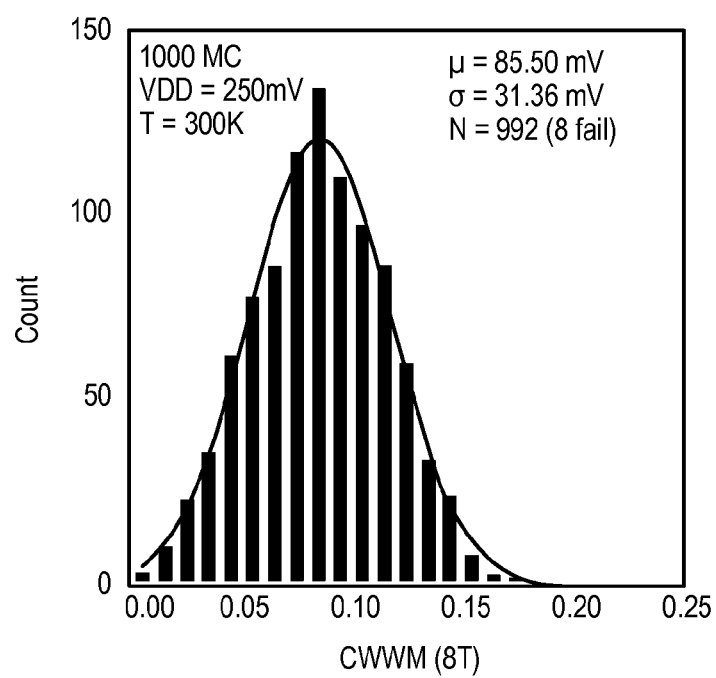
Figure 10K:
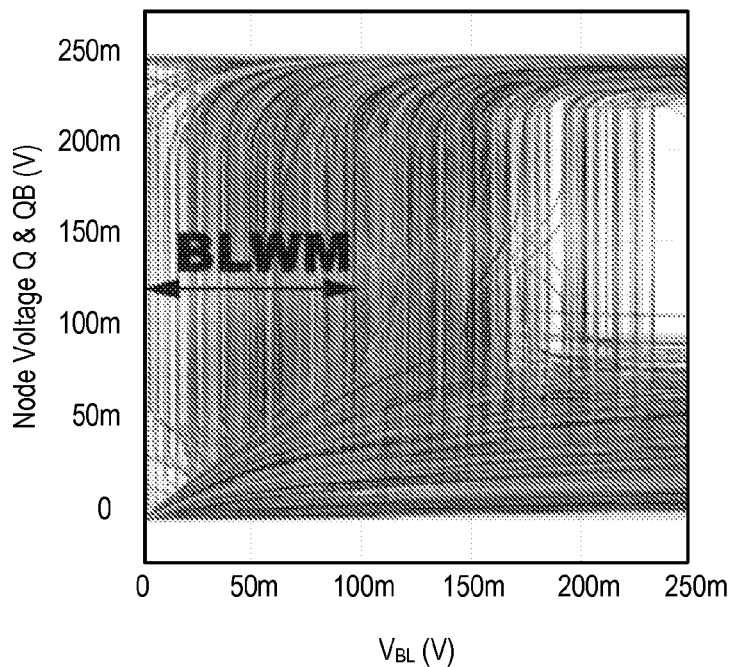
Figure 10L:
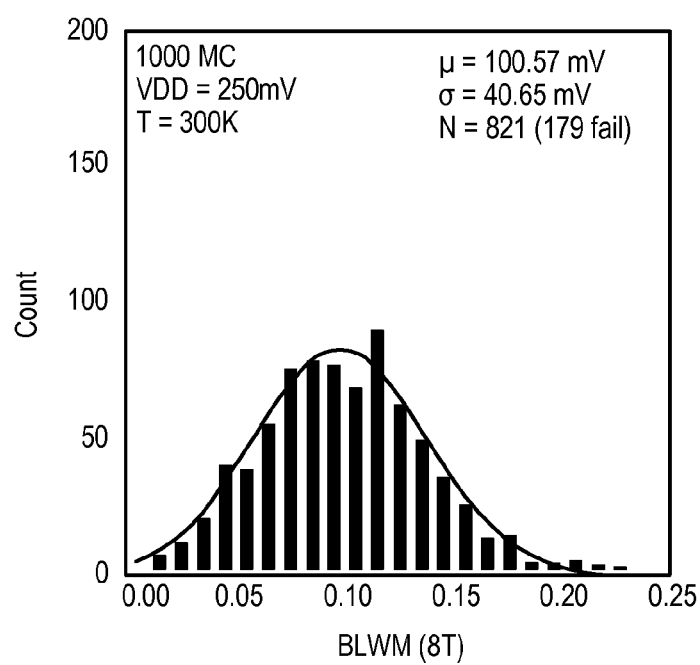
Figure 10M:
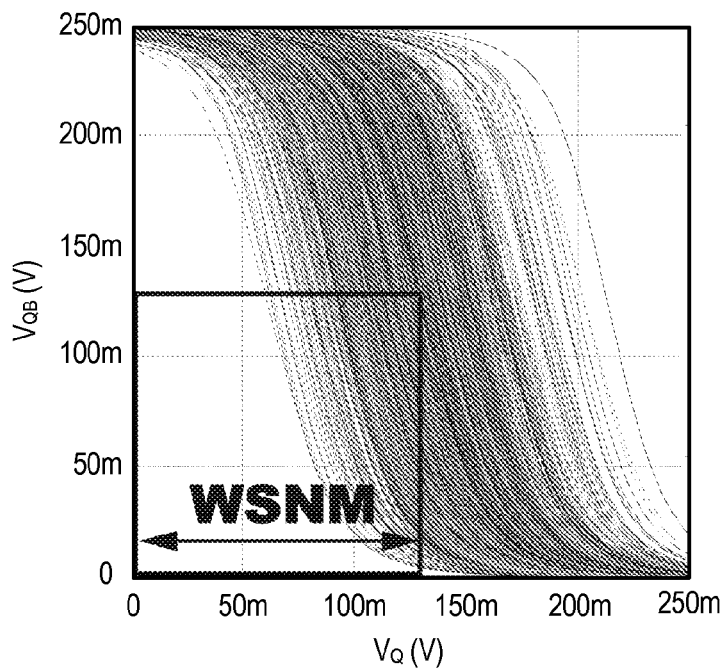
FIGS. 10M-10R are graphs depicting simulation results for write static noise margin (WSNM), combined wordline write margin (CWWM) and bitline write margin (BLWM), respectively, for a 13T SRAM cell arrangement.
Figure 10N:
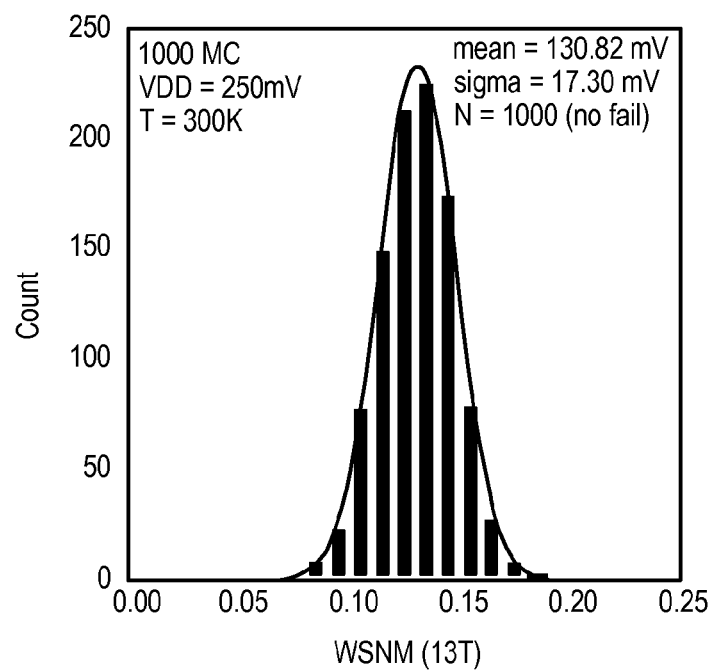
Figure 10O:
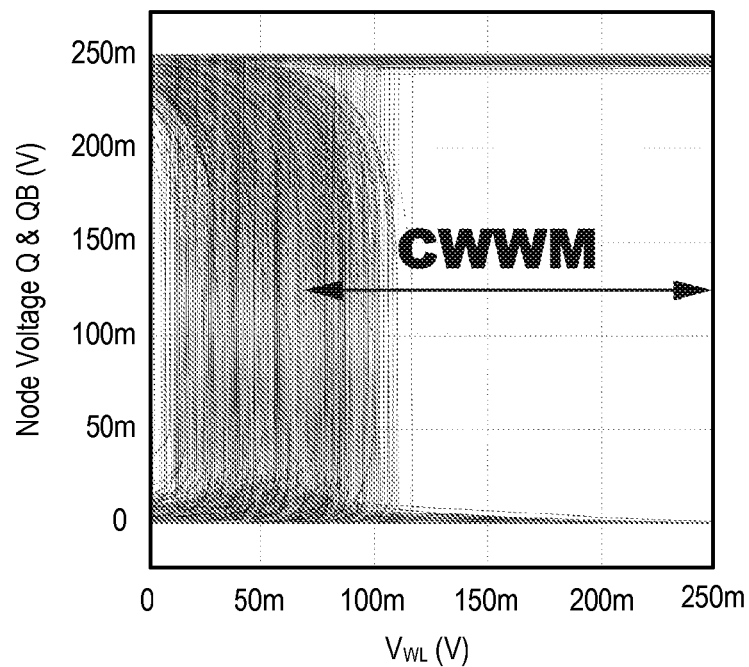
Figure 10P:
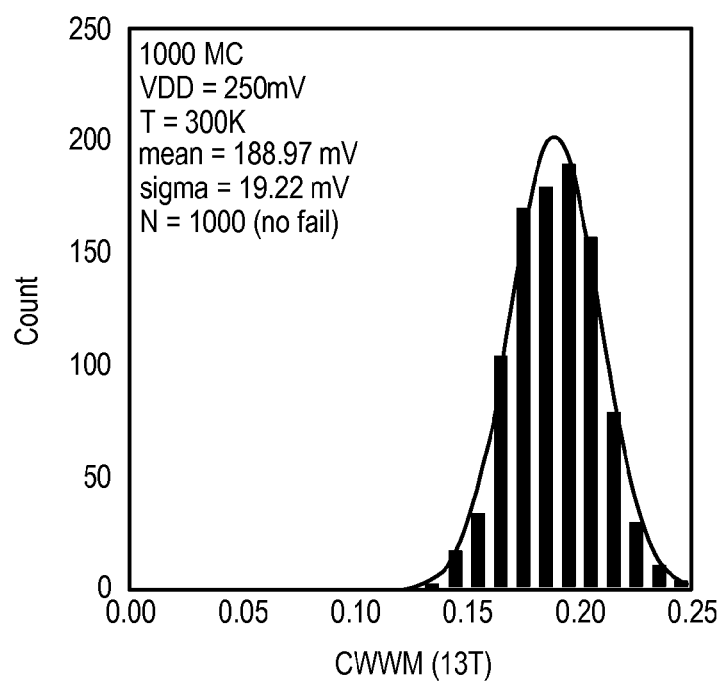
Figure 10Q:
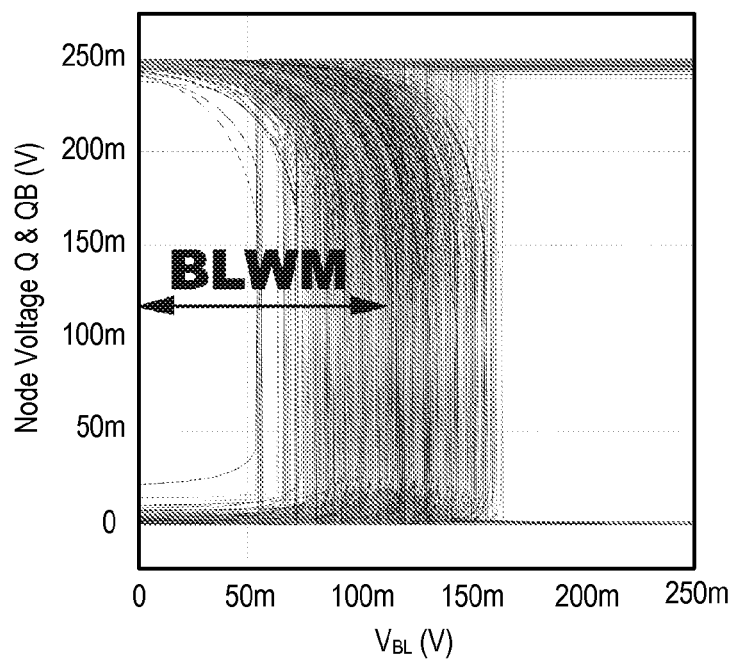
Figure 10R:
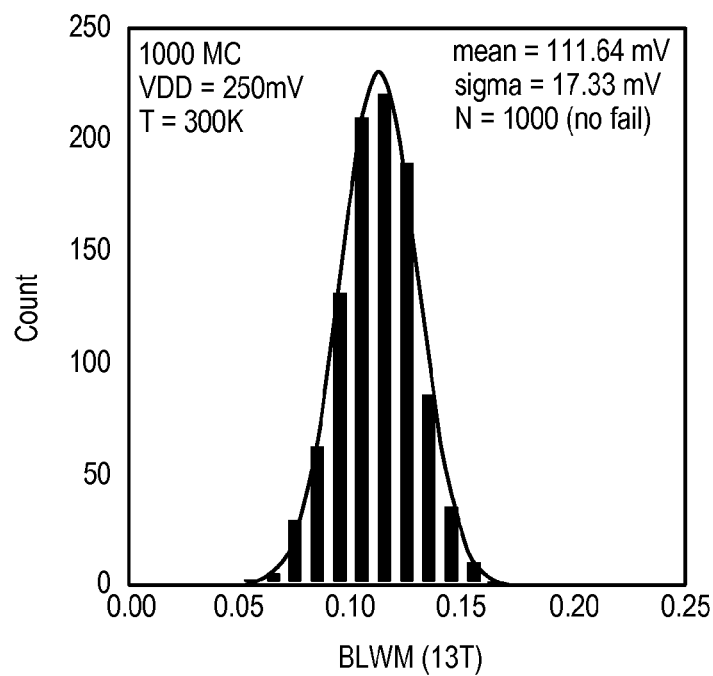

Simulation results of read SNM is shown in FIG. 9. At the nominal case (VDD=1.0V), the read SNMs of 6T, 8T, and 13T bitcells in 40 nm CMOS technology are 184.55 mV, 381.17 mV, and 387.31 mV, respectively. As mentioned earlier, the read SNM of the proposed 13T SRAM bitcell is very similar to the conventional 8T SRAM bitcell. At sub-threshold region (VDD=0.25V), the read SNMs of 6T, 8T, and 13T cells are 24.23 mV, 69.66 mV, and 69.00 mV, respectively. Hence, the read SNM of the proposed 13T SRAM is comparable to the conventional 8T SRAM.

Since noise can incur at any node including a storage node, wordline, and bitline, investigation of each write margin definition is essential. WSNM, CWWM, and BLWM curves and spreads of 6T, 8T, and 13T bitcells simulated at VDD=250 mV under the process and mismatch variations are shown in FIG. 10. The 6T and 8T bitcells fail in some iterations of WSNM, CWWM, and BLWM, while the 13T bitcell does not fail at all in any write margin definition. Thus, the comparison among those cells by the mean and sigma of these spreads seems inappropriate since the mean and sigma of WSNM, CWWM, and BLWM exclude failed iterations. The pull-up ratio (PR) of 6T bitcell is set to 1, and the cell ratio (CR) is set to 2. Both PR and CR of the 8T bitcell is set to 1, and the read access transistors are sized as 2×. The proposed 13T bitcell is sized in order to be comparable to the read performance of the 8T bitcell, so read access devices M12 and M13 are sized as same as those in 8T bitcell. Device M7 to M11 are also sized up so that the 13T bitcell can be comparable to 8T bitcell during write operation.

The mean of WSNM for 6T, 8T, and 13T bitcells are 100.08 mV, 116.05 mV, and 130.82 mV respectively. The μ/σ if WSNM for 6T, 8T, and 13T are 1.97, 2.42, and 7.56, respectively, meaning that 13T bitcell is 3.84 times better than 6T and 3.12 times better than 8T in μ/σ. The mean of CWWM for 6T, 8T, and 13T are 74.91 mV, 85.50 mV, and 188.97 mV, respectively. The μ/σ of CWWM for 6T, 8T, and 13T are 1.95, 2.73, and 9.83, respectively. Thus, the μ/σ of 13T is 5.04 times greater than that of 6T and 3.60 times greater than 8T. In BLWM, the mean of 6T, 8T, and 13T are 87.66 mV, 100.57 mV, and 111.64 mV, respectively. The μ/σ of BLWM for 6T, 8T, and 13T are 2.28, 2.47, and 6.44, respectively. Therefore, BLWM of 13T are 2.82 times better than that of 6T and 2.61 times better than that of 8T. The statistics of the write margin simulations are shown in Table I.

TABLE I

SRAM CELL WRITE MARGIN SIMULATION
RESULTS (1000 MC, T = 300 K)

|  |  | 6 T | 8 T | 13 T |
|---|---|---|---|---|
| WSNM | μ | 100.08 mV | 116.05 mV | 130.82 mV |
|  | σ | 50.91 mV | 47.97 mV | 17.30 mV |
|  | μ/σ | 1.97 | 2.42 | 7.56 |
|  | fail | 118 fail | 14 fail | No fail |
| CWWM | μ | 74.91 mV | 85.50 mV | 188.97 mV |
|  | σ | 38.36 mV | 31.36 mV | 19.22 mV |
|  | μ/σ | 1.95 | 2.73 | 9.83 |
|  | fail | 58 fail | 8 fail | No fail |
| BLWM | μ | 87.66 mV | 100.57 mV | 111.64 mV |
|  | σ | 38.38 mV | 40.65 mV | 17.33 mV |
|  | μ/σ | 2.28 | 2.47 | 6.44 |
|  | fail | 301 fail | 179 fail | No fail |

These statistics exclude failed iterations.

Note that the sparser curve means more write margin as shown in FIG. 10. In particular, one of the VTCs of the 13T bitcell has the same shape as the VTC in the read SNM, while the other is a straight line along the y-axis. This trend is seen even in the sub-threshold region, meaning 13T bitcell is comparably robust in write operation in any operation condition. This is because the 13T bitcell is operated in static mode. As shown in the figure, the proposed 13T SRAM bitcell is robust under ±3σ variations.

Read access time of a bitcell is simulated as the delay from 50% of read wordline voltage to 50% voltage of BL. Similarly, write access time is simulated as the delay from 50% of write wordline voltage to 50% of written storage node voltage. The simulation results are shown in Table II.

In read operation, the proposed bitcell shows a comparable performance to 8T bitcell both in super-threshold and in sub-threshold region since the read access transistors are sized as same as 8T bitcell. As 8T bitcell, the current driving capabilities of the read access devices determine read delay.

For write operation, the proposed 13T bitcell shows a good result in the super-threshold region. However, the write performance in the sub-threshold region becomes worse than the other 6T and 8T bitcells. This is because the other two bitcells have feedback during write operation that accelerates write operation, while the proposed 13T bitcell is operated in static mode, meaning that only discharging and charging currents determine the write performance. Thus, the write performance of the 13T bitcell becomes worse as it goes in the sub-threshold region since current decreases exponentially in that region. In other words, the writing process of the 13T bitcell is done sequentially. For instance, '0' is stored at node Q, and '1' is stored at node QB. When '1' is written to node Q, node QB storing '1' begins to be discharged. After this discharge, node Q starts to be charged. While the conventional 6T and 8T bitcells actively charge a storage node through the pass transistors, the proposed 13T bitcell waits for discharging. Thus, this innate structure brings about relatively worse write performance in the sub-threshold region. However, when there is a certain requirement of performance, the proposed 13T bitcell

TABLE II

SRAM CELL DELAY COMPARISON (T = 300 K)

|  | Read | | Write | |
|---|---|---|---|---|
| SRAM bitcell | VDD = 1.0 V | VDD = 250 mV | VDD = 1.0 V | VDD = 250 mV |
| 6 T | 15.04 ps | 18.81 ns | 60.29 ps | 173.80 ns |
| 8 T | 12.70 ps | 14.71 ns | 67.23 ps | 118.94 ns |
| 13 T | 10.36 ps | 14.21 ns | 59.89 ps | 205.40 ns |

Read and write delay is simulated from 50% of wordline voltage to 50% of the storage node voltage.

could achieve the requirement since there is no sizing constraint. In this case, area and power can be traded off with performance.

A 256-row×1 bit SRAM array block is simulated for power consumption at VDD=250 mV with 100 kHz clock frequency. The comparison of power dissipations among different arrays is shown in Table III. The 6T bitcell

TABLE III

256 ROWS × 1 BIT SRAM ARRAY POWER DISSIPATION COMPARISON (VDD = 0.25 V, T = 300 K, CLK = 100 KHz)

| SRAM bitcell | Read | Write |
| --- | --- | --- |
| 6 T | 6.158 nW | 17.95 nW |
| 8 T | 13.44 nW | 12.89 nW |
| 13 T | 27.22 nW | 21.21 nW | consumes less power than the others since it has less devices.

Table IV shows the supply voltage of each bitcell required for WSNM=130 mV, which is 13T bitcell's at VDD=250 mV. In order to maintain the same WSNM with 13T bitcell, the 6T bitcell needs to operate at 426 mV, while the 8T bitcell does at 383 mV. Therefore, another power comparison needs to be performed with these supply voltage when reliability is of concern as shown in Table V.

When WSNM is taken into consideration, both the 6T and 8T bitcells are more power dissipating than the 13T bitcell for write operation. However, the proposed 13T bitcell is comparable to 8T bitcell during read operation, and the 6T bitcell is less power consuming for read operation.

TABLE IV

SUPPLY VOLTAGE FOR WSNM = 0.130 V (T = 300 K)

| | 6 T | 8 T | 13 T |
| --- | --- | --- | --- |
| VDD | 462 mV | 383 mV | 250 mV |

TABLE V

THE NORMALIZED POWER DISSIPATION COMPARISON OF 256 ROWS × 1 BIT SRAM ARRAY (WSNM = 0.130 V, T = 300 K, CLK = 100 kHz)

| SRAM bitcell | Read | Write |
| --- | --- | --- |
| 6 T | 0.54 × (14.72 nW @462 mV) | 1.19 × (25.24 nW @462 mV) |
| 8 T | 1.05 × (28.61 nW @383 mV) | 1.77 × (37.45 nW @383 mV) |
| 13 T | 1.00 × (27.22 nW @250 mV) | 1.00 × (21.21 nW @250 mV) |

One of the important metrics of SRAM bitcell is the leakage current through read access transistors since it limits the number of cells sharing bitlines. The leakage through read access devices to bitlines of the 6T, 8T, and 13T at VDD=250 mV are 7.2 pA, 278.3 fA, and 278.3 fA, respectively. This is reasonable since both 8T and 13T bitcells decouple a bitline from the storage node, and these cells have the same structure for read operation.

The proposed 13T bitcell dramatically improves the write margin by eliminating the charge contention due to the feedback structure of an SRAM cell. Its structure allows static operation during writing by blocking the power supply route. Since there is no charge contention, no sizing constraint exists. Only pull-up devices are sized two times for balancing the VTCs of back-to-back inverters. In three different definitions of write margin including WSNM, CWMM, and BLWM, the 13T bitcell is more robust than the conventional 6T and 8T bitcells. The proposed 13T SRAM cell seems to have more area and power overhead than the conventional cells, but it is more power saving for the ultra-low power applications when a certain reliability requirement is considered. In addition, the WSNM analytical model of the 13T SRAM bitcell is proposed. The analytical model for super-threshold fits within 8.7% errors, while the sub-threshold model fits within 14.2% errors. When β ratio changes from 1 to 5, the super-threshold model fits within 6.17% while the sub-threshold model fits within 15.42% errors.

Figure 11:
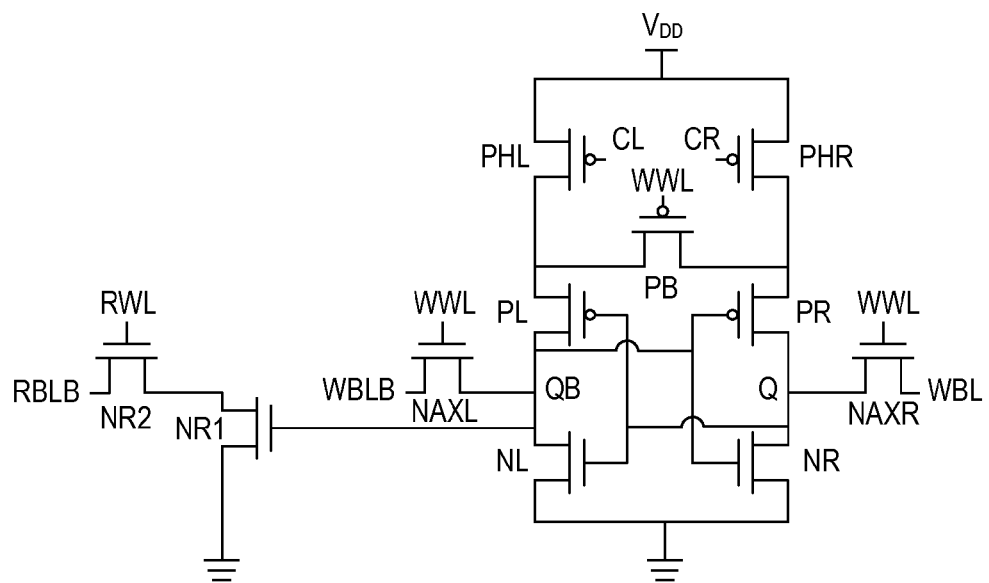
FIG. 11 is a schematic of an example embodiment of a SRAM cell having eleven transistors (11T SRAM cell)

FIG. 11 is schematic of another example embodiment of an SRAM cell having an improved write noise margin. In this example embodiment, storage nodes Q and QB are comprised of transistors PL, NL, PR and NR. These transistors are arranged as a pair of inverters cross coupled with each other. The transistors may be further defined as field-effect transistors (FETs), where the PL and PR have p-type channels and NL and NR have n-type channels.

Write operations are performed through write access switches comprised of left access transistor NAXL and right access transistor NAXR. Supply switches are also added to improve the write noise margin and are comprised of left header transistor PHL, right header transistor PHR and bridge transistor PB. These switches are used to reduce charge contention during write operations as will be further described below. Read operations are performed through read access switches comprised of read transistors NR1 and NR2. Read operations are performed in the manner described above in relation to the 13T SRAM cell and thus are not described here for brevity. Thus, the second embodiment is a SRAM cell comprised of eleven transistors.

In standby mode and read mode, control signals CL and CR are equal to $V_m$, where $V_{mm}$ is a voltage level between $V_{dd}$ and $V_{ss}$. Gate voltages on both transistors PHL and PHR effectively decrease the supply voltage of the cell below them. Therefore, the leakage is reduced significantly.

Assume storage node Q is holding a '1' value (i.e., at a higher voltage state than storage node QB) and a write operation is initiated to write a '1' value to storage node QB. To do so, a value of '1' is first applied to the write bit line (WBLB) connected to storage node QB while continuing to apply a value of '0' to the write bit line (WBL) connected to storage node Q. The write operation is then initiated by applying a '1' to write word line (WWL). These steps will turn off right header transistor PHR and thereby cut power supply to storage node Q. As a result, right access transistor NAXR more easily drags node Q down to Vss without charge contention. During a write operation, it is noted that control signal CL is set to WBL and CR is set to WBLB.

Figure 12:
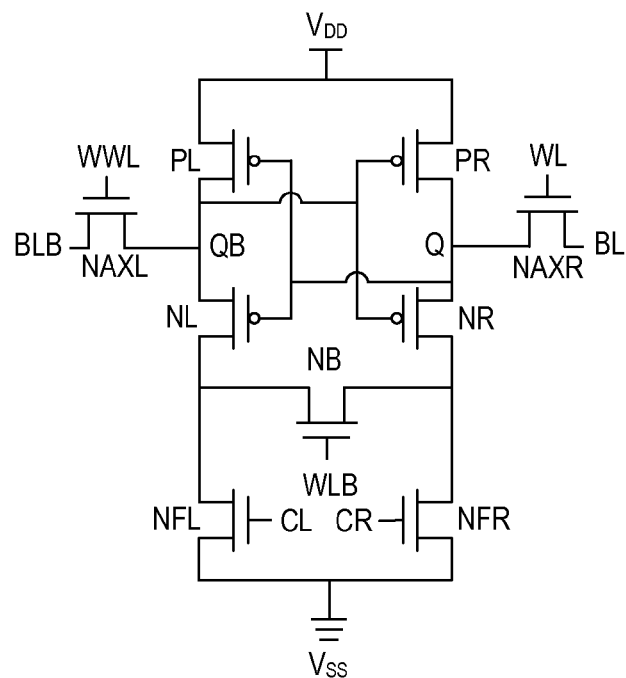
FIG. 12 is a schematic of an example embodiment of a SRAM cell having nine transistors (9T SRAM cell).

FIG. 12 is schematic of a third example embodiment of a SRAM cell having an improved write noise margin. In this example embodiment, storage nodes Q and QB are comprised of transistors PL, NL, PR and NR. These transistors are arranged as a pair of inverters cross coupled to each other. The transistors may be further defined as field-effect transistors (FETs), where the PL and PR have p-type channels and NL and NR have n-type channels. Other types of transistors may be used to implement the SRAM cell.

Write operations are performed through write access switches comprised of left access transistor NAXL and right access transistor NAXR. Supply switches are also added to improve the write noise margin, read noise margin, leakage power consumption. Supply switches are defined as left footer transistor NFL and right footer transistor NFR and bridge transistor NB. Thus, the third embodiment of a SRAM cell is comprised of only nine transistors.

Assume storage node Q is holding a '1' value and a write operation is initiated to write a '1' value to storage node QB. To do so, a value of '1' is first applied to the bit line (BLB) connected to storage node QB while continuing to apply a value of '0' to the bit line (BL) connected to storage node Q. The write operation is then initiated by applying a '1' to write word line (WWL). Because the NMOS cannot strongly conduct '1', the process of charging node QB would be relatively slow. In this embodiment, however, when node QB is charged a little higher than '0', it will reduce the pull-up strength of transistor PR which reduces charge contention on node Q. In other words, transistor PR is turned off and thereby cuts off supply voltage to node Q. This makes writing a '0' at node Q much easier. Right footer transistor NFR is also turned on to provide a discharge path to Vss. During the write operation, control signal CL is set to BL and CR is set to BLB.

The read operation is conducted only through transistor NAXR. During a read operation, a destructive read may happen if there is a '0' stored in node Q and the bit line charges node Q to the point that it can flip the data in node QB. In this embodiment, the pull down network at node QB is weakened because of the weak Vmm drive of right footer transistor NFR. Therefore, node QB will be harder to flip. Consequently, the read noise margin of this embodiment is higher than a traditional 6T arrangement. It is noted that control signals CL is set to $V_{mm}$ and CR is set to $V_{dd}$ for cells in read operation.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for performing a write operation in a static random access memory (SRAM) circuit, comprising:
   supplying a supply voltage ($V_{dd}$-$V_{ss}$) to a pair of inverters cross coupled to each other and forming a pair of storage nodes;
   applying a value to be written to a write bit line while reducing charge contention between the storage nodes, where the write bit line is used to write values to the pair of storage nodes; and
   resetting value applied to the write bit line and concurrently resupplying the supply voltage to the pair of storage nodes.

2. The method of claim 1 further comprises supplying a supply voltage ($V_{dd}$-$V_{ss}$) via two or more supply switches disposed between a supply voltage ($V_{dd}$-$V_{ss}$) and the pair of inverters.

3. The method of claim 1 wherein reducing charge contention further comprises cutting off the supply voltage ($V_{dd}$-$V_{ss}$) to a given storage node in the pair of storage nodes, where the given storage node has a higher voltage state than other storage node in the pair of storage nodes.

4. The method of claim 3 wherein cutting off the supply voltage ($V_{dd}$-$V_{ss}$) further comprises applying a signal to a write word line and thereby connecting the write bit line to the given storage node.

5. The method of claim 4 further comprises connecting the write bit line to the given storage node via write access switches disposed between the write bit line and the pair of inverters.

6. The method of claim 5 wherein cutting off the supply voltage further comprises supplying the supply voltage ($V_{dd}$-$V_{ss}$) to the other storage node in the pair of storage nodes.

7. The method of claim 6 wherein resetting the value applied to the write bit line further comprises resetting the value applied to the write word line.

8. The method of claim 1 wherein reducing charge contention further comprises forming a discharge path from the given node to ground.

9. A static random access memory circuit, comprising:
   a pair of inverters cross coupled to each other to form two storage nodes;
   one or more write access switches electrically coupled between write bit lines and two storage nodes and operable, in response to a signal on a write word line, to connect the two storage nodes to the write bit lines, where the write bit lines are used to write values to the two storage nodes during a write operation; and
   two or more supply switches electrically coupled between a supply voltage and the pair of inverters and operable, in response to a signal on at least one of the write bit lines, to selectively connect the supply voltage to at least one of the inverters in the pair of inverters.

10. The static random access memory circuit of claim 9 wherein, during a write operation, the supply switches operate to cut off the supply voltage ($V_{dd}$-$V_{ss}$) to the inverter in the pair of inverters having a charged state.

11. The static random access memory circuit of claim 9 further comprises one or more read access switches electrically coupled between a read bit line and the two storage nodes and operable, in response to a signal on a read word line, to connect the two storage nodes to the read bit line, where the read bit line is used to read values of the two storage nodes during a read operation.

12. The static random access memory circuit of claim 11 wherein, during a read operation, the supply switches operate to connect the supply voltage ($V_{dd}$-$V_{ss}$) to the pair of inverters.

13. The static random access memory circuit of claim 9 wherein the supply switches are further defined as two pairs of field-effect transistors (FET) having a p-type channel, each pair of FETs having source terminals coupled to the supply voltage ($V_{dd}$), drain terminals coupled to one of the two inverters, one gate terminal coupled to a write bit line and the other gate terminal coupled to the write word line.

14. The static random access memory circuit of claim 9 wherein the supply switches are two field-effect transistors (FET) having a p-type channel, each FET having a source terminal coupled to the supply voltage ($V_{dd}$), a drain terminal coupled to one of the two inverters and a gate terminal coupled to a write bit line.

15. The static random access memory circuit of claim 9 wherein the supply switches are two field-effect transistors (FET) having a n-type channel, each FET having a drain terminal coupled to one of the two inverters, a source terminal coupled to the supply voltage ($V_{ss}$) and a gate terminal coupled to a write bit line.

16. The static random access memory circuit of claim 9 wherein the write access switches are further defined as field-effect transistors (FET), such that
   a first write access FET having a drain terminal coupled to one of the two storage nodes and a gate terminal coupled to one of the two write bit lines;
   a second write access FET having a drain terminal coupled to the other of the two storage nodes and a gate terminal coupled to the other of the two write bit lines; and
   a third write access FET having a drain terminal coupled to each of the source terminals for the first and second write access FETs, a gate terminal coupled to the write word line, and a source terminal coupled to ground.

17. A static random access memory circuit, comprising:
   a pair of inverters cross coupled to each other to form two storage nodes;
   two write bit lines electrically connected to the two storage nodes and operable to write values to the two storage nodes;
   a first write access transistor having a drain terminal coupled to one of the two storage nodes and a gate terminal coupled to one of the two write bit lines;
   a second write access transistor having a drain terminal coupled to the other of the two storage nodes and a gate terminal coupled to other of the two write bit lines;
   a third write access transistor having a drain terminal coupled to each of the source terminals for the first and second write access transistors, a gate terminal coupled to the write word line, and a source terminal coupled to ground;
   a first pair of supply transistors electrically coupled between a supply voltage and one of the storage nodes, where, in response to a signal on one of the two write bit lines, one of the supply transistors in the first pair of supply transistors connects the supply voltage to the one storage node; and
   a second pair of supply transistors electrically coupled between the supply voltage and other of the storage nodes where, in response to a signal on the other of the two write bit lines, one of the supply transistors in the second pair of supply transistors connects the supply voltage to the other storage node, wherein, during a write operation, the supply transistors operate to cut off the supply voltage to the inverter in the pair of inverters having a charged state.

18. The static random access memory circuit of claim 17 wherein the write access transistors are further defined as field-effect transistors (FETs).

19. The static random access memory circuit of claim 17 wherein the first pair of supply transistors are further defined as field-effect transistors (FETs) having a p-type channel, each of the supply transistors having its source terminal coupled to the supply voltage and drain terminals coupled to one of the two inverters, a gate terminal of one of the supply transistor being coupled to a write bit line and a gate terminal of other supply transistor coupled to a write word line.

20. The static random access memory circuit of claim 17 further comprises one or more read access transistor electrically coupled between a read bit line and the two storage nodes and operable, in response to a signal on a read word line, to connect the two storage nodes to the read bit line, where the read bit line is used to read values of the two storage nodes during a read operation.

21. The static random access memory circuit of claim 20 further comprises a first read access transistor and a second read access transistor having drain terminals coupled together, the first read access transistor having its gate terminal coupled to the storage nodes and its source terminal coupled to ground, the second read access transistor having its gate terminal coupled to the read word line and its source terminal coupled to ground.

* * * * *